(12) United States Patent
Coleman et al.

(10) Patent No.: US 10,304,937 B2
(45) Date of Patent: May 28, 2019

(54) SCALABLE PROCESS FOR PRODUCING EXFOLIATED DEFECT-FREE, NON-OXIDISED 2-DIMENSIONAL MATERIALS IN LARGE QUANTITIES

(71) Applicant: The Provost, Fellows, Foundation Scholars, and the Other Members of Board, of the College of the Holy and Undivided Trinity of Queen Elizabeth, Near Dublin, Dublin (IE)

(72) Inventors: Jonathan Coleman, Dublin (IE); Keith Paton, Co. Dublin (IE)

(73) Assignee: The Provost, Fellows, Foundation Scholars, and the Other Members of Board, of the College of the Holy and Undivided Trinity of Queen Elizabeth Near Dublin, Dublin (IE)

( * ) Notice: Subject to any disclaimer, the term of this patent is extended or adjusted under 35 U.S.C. 154(b) by 489 days.

(21) Appl. No.: 14/773,011

(22) PCT Filed: Mar. 14, 2014

(86) PCT No.: PCT/EP2014/055183
§ 371 (c)(1),
(2) Date: Sep. 4, 2015

(87) PCT Pub. No.: WO2014/140324
PCT Pub. Date: Sep. 18, 2014

(65) Prior Publication Data
US 2016/0009561 A1    Jan. 14, 2016

Related U.S. Application Data

(60) Provisional application No. 61/786,068, filed on Mar. 14, 2013.

(30) Foreign Application Priority Data

Mar. 15, 2013   (GB) .................................. 1304770.9

(51) Int. Cl.
  *H01L 51/44*   (2006.01)
  *H01G 9/20*   (2006.01)
  (Continued)

(52) U.S. Cl.
  CPC ............ *H01L 29/45* (2013.01); *C01B 19/007* (2013.01); *C01B 19/04* (2013.01); *C01B 21/064* (2013.01);
  (Continued)

(58) Field of Classification Search
  CPC ... C01B 3/0469; C01B 19/04; C01B 21/0648; C01B 31/0469; C01G 39/06;
  (Continued)

(56) References Cited

U.S. PATENT DOCUMENTS 5,186,919 A    2/1993   Bunnell
7,906,053 B1   3/2011   Torkelson et al.
(Continued)

FOREIGN PATENT DOCUMENTS

CN    101671015    3/2010
CN    102583350    7/2012
(Continued)

OTHER PUBLICATIONS

Saeed M. Alhassan, Syed Qutubuddin, and David A. Schiraldi, Graphene Arrested in Laponite—Water Colloidal Glass,Langmuir 2012, 28, 4009-4015. © 2012 American Chemical Society.*
(Continued)

*Primary Examiner* — Bijan Ahvazi
(74) *Attorney, Agent, or Firm* — K&L Gates LLP

(57) ABSTRACT

A process for exfoliating untreated 3-dimensional material to produce a 2-dimensional material, said process compris-
(Continued)

ing the steps of mixing the untreated 3-dimensional material in a liquid to provide a mixture; applying shear force to said mixture to exfoliate the 3-dimensional material and produce dispersed exfoliated 2-dimensional material in solution; and removing the shear force applied to said mixture, such that the dispersed exfoliated 2-dimensional material remains free and unaggregated in solution.

16 Claims, 14 Drawing Sheets

(51) Int. Cl.
| | | |
|---|---|---|
| C01B 21/064 | (2006.01) | |
| H01L 31/0224 | (2006.01) | |
| H01L 29/45 | (2006.01) | |
| C01B 19/00 | (2006.01) | |
| C01B 21/083 | (2006.01) | |
| C01G 39/06 | (2006.01) | |
| C01G 39/00 | (2006.01) | |
| C01G 41/00 | (2006.01) | |
| C09C 1/46 | (2006.01) | |
| C09C 3/04 | (2006.01) | |
| C01B 19/04 | (2006.01) | |
| H01G 4/008 | (2006.01) | |
| H01G 9/042 | (2006.01) | |
| H01G 11/36 | (2013.01) | |
| H01L 33/40 | (2010.01) | |
| H01M 4/583 | (2010.01) | |
| C01B 32/19 | (2017.01) | |

(52) U.S. Cl.
CPC ........ *C01B 21/0648* (2013.01); *C01B 21/083* (2013.01); *C01B 32/19* (2017.08); *C01G 39/00* (2013.01); *C01G 39/06* (2013.01); *C01G 41/00* (2013.01); *C09C 1/46* (2013.01); *C09C 3/04* (2013.01); *H01G 4/008* (2013.01); *H01G 9/042* (2013.01); *H01G 9/2045* (2013.01); *H01G 11/36* (2013.01); *H01L 31/022425* (2013.01); *H01L 33/40* (2013.01); *H01L 51/441* (2013.01); *H01M 4/583* (2013.01); *C01P 2002/82* (2013.01); *C01P 2004/04* (2013.01); *C01P 2004/24* (2013.01); *Y02P 20/582* (2015.11)

(58) Field of Classification Search
CPC . C01G 41/00; H01L 29/45; H01L 31/022425; H01L 33/40; H01L 51/441; H01M 4/583; H01G 4/008; H01G 9/042; H01G 11/36; H01G 9/2045
See application file for complete search history.

(56) References Cited

U.S. PATENT DOCUMENTS

| 8,132,746 B2 | 3/2012 | Zhamu et al. |
| 2011/0086965 A1 | 4/2011 | Zhi et al. |

FOREIGN PATENT DOCUMENTS

| CN | 102701190 | 10/2012 | |
| GB | 2483288 | 7/2012 | |
| KR | 10-2011-0077606 | 7/2011 | |
| WO | 2011/014347 | 2/2011 | |
| WO | 2012/028724 | 3/2012 | |
| WO | 2012/101457 | 8/2012 | |
| WO | 2013/010211 | 1/2013 | |
| WO | WO 2013/010211 | * | 1/2013 |
| WO | 2013/106963 | 7/2013 | |

OTHER PUBLICATIONS

Li Ling A. Koh & Jayani Chandrapala & Bogdan Zisu & Gregory J. O. Martin & Sandra E. Kentish A Comparison of the Effectiveness of Sonication, High Shear Mixing and Homogenisation on Improving the Heat Stability of Whey Protein Solutions, Food Bioprocess Technol (2014) 7:556-566.*
Alhassan et al., Graphene Arrested in Laponite—Water Colloidal Glass, Langmuir, 28:4009-4015, 2012.
Bae et al., "Roll-to-roll production of 30-inch graphene films for transparent electrodes," Nature Nanotechnology, 5:574-578, 2010.
Berger et al., "Electronic Confinement and Coherence in Patterned Epitaxial Graphene," Science, 312:1191-1196, 2006.
Coleman et al., "Two-Dimensional Nanosheets Produced by Liquid Exfoliation of Layered Materials," Science, 331:568-571, 2011.
Cunningham et al., "Solvent Exfoliation of Transition Metal Dichalcogenides: Dispersibility of Exfoliated Nanosheets Varies Only Weakly between Compounds," ACS Nano, 6(4):3468-3480, 2012.
Dreyer et al., "The chemistry of graphene oxide," Chemical Society Reviews, 39:228-240, 2012.
Eda et al., "Photoluminescence from Chemically Exfoliated MoS2," Nano Lett. 11:511-5116, 2011.
Geim et al., "The rise of graphene," Nature Materials, 6:183-191, 2007.
Hall et al., "Scaling Up of Silverson Rotor-Stator Mixers," The Canadian Journal of Chemical Engineering, 89:1040-1050, 2011.
Hernandez et al., "High-yield production of graphene by liquid-phase exfoliation of graphite," Nature Nanotechnology, 3:563-568, 2008.
Hernandez et al., "Measurement of Multicomponent Solubility Parameters for Graphene Facilitates Solvent Discovery," Langmuir, 26(5):3208-3212, 2010.
Joensen et al., Single-Layer MoS2, Materials Research Bulletin, 21 :457-461, 1986.
Kim et al., "Large-scale pattern growth of graphene films for stretchable transparent electrodes," Nature, 457:706-710, 2009.
Kuilla et al., "Recent advances in graphene based polymer composites," Progress in Polymer Science, 35:1350-1375, 2010.
Lee et al., "Measurement of the Elastic Properties and Intrinsic Strength of Monolayer Graphene," Science, 321:385-388, 2008.
Li et al., "Large-Area Synthesis of High-Quality and Uniform Graphene Films on Copper Foils," Science, 324:312-1314, 2009.
Lyklema, "The surface tension of pure liquids—Thermodynamic components and corresponding states," Colloids and Surfaces A: Physicochemical and Engineering Aspects, 156:413-421, 1999.
Novoselov et al., "Electric Field Effect In atomically Thin Carbon Films," Science, 306:666-669, 2004.
Ruoff, "Calling all chemists," Nature Nanotechnology 3:10-11, 2008.
Shih et al., Bi- and trilayer graphene solutions, Nature Nanotechnology, 6:439-445, 2011.
Smith et al., "Large-Scale Exfoliation of Inorganic Layered Compounds in Aqueous Surfactant Solutions," Advanced Materials, 23:3944-3948, 2011.
Stankovich et al., "Synthesis of graphene-based nanosheets via chemical reduction of exfoliated graphite oxide," Carbon, 45:1558-1565, 2007.
Tsierkezos et al., "Thermodynamic investigation of N,N-dimethylformamide/touene binary mixtures in the temperature range from 278.15 to 293.15K," J. Chem. Thermodynamics, 38:952-961, 2006.
Zhan et al., "Large-Area Vapor-Phase Growth and Characterization of MoS2 Atomic Layers on a SiO2 Substrate," Small, 8(7):966-971, 2012.
Alhassan, Saeed M. et al., "Graphene Arrested in Aponite—Water Colloidal Glass", American Chemical Society, vol. 28, (2012), pp. 4009-4015.
Wang, Xuan, et al. "Transparent, Conductive Graphene Electrodes for Dye-Sensitized Solar Cells", Nano Letters, vol. 8, No. 1, (2008), pp. 323-327.

* cited by examiner

SCALABLE PROCESS FOR PRODUCING EXFOLIATED DEFECT-FREE, NON-OXIDISED 2-DIMENSIONAL MATERIALS IN LARGE QUANTITIES

CROSS REFERENCE TO RELATED APPLICATIONS

This is the national phase under 35 U.S.C. § 371 of International Application No. PCT/EP2014/055183, filed on Mar. 14, 2014, which claims priority to and the benefit of U.S. Patent Application No. 61/786,068, filed on Mar. 14, 2013 and United Kingdom Patent Application No. 1304770.9, filed on Mar. 15, 2013, the entire disclosures of each of which are incorporated by reference herein.

FIELD OF THE INVENTION

The invention relates to a process for producing atomically thin 2-dimensional materials, for example, graphene. In particular, the invention relates to a simple, scalable process for producing high-quality, defect-free, unoxidised 2-dimensional materials, for example graphene, in industrial quantities. Such a material will have applications in composites, coatings and electronic devices.

BACKGROUND TO THE INVENTION

A wide range of 2-dimensional (2-D) atomic crystals exist in nature. The simplest and most studied is graphene (an atomic-scale 2-D honeycomb lattice of carbon atoms), followed by Boron Nitride (BN). However, hundreds more exist including transition metal dichalcogenides (TMDs) such as Molybdenum disulphide ($MoS_2$), Niobium selenide ($NbSe_2$), Vanadium telluride ($VTe_2$), transmission metal oxides such as Manganese dioxide ($MnO_2$) and other layered compounds such as Antimony telluride ($Sb_2Te_3$), Bismuth telluride ($Bi_2Te_3$). Depending on the exact atomic arrangement, these crystals can be metals, insulators or semiconductors.

Layered materials, come in many varieties with one family having the formula $MX_n$ (where M=Ti, Zr, Hf, V, Nb, Ta, Cr, Mn, Mo, W, Tc, Re, Ni, Pd, Pt, Fe, Ru; X=O, S, Se, Te; and $1 \leq n \leq 3$). A common group are the transition metal dichalcogenides (TMDs) which consist of hexagonal layers of metal atoms sandwiched between two layers of chalcogen atoms. While the bonding within these tri-layer sheets is covalent, adjacent sheets within a TMD crystal are weakly bound by van der Waals interactions. Depending on the co-ordination and oxidation state of the metal atoms, TMDs can be metallic or semiconducting. For example, Tungsten disulphide ($WS_2$) is a semiconductor while Tantalum disulphide ($TaS_2$) and Platinum telluride ($PtTe_2$) are metals. This versatility makes them potentially useful in many areas of electronics.

Over the last decade graphene has become the most studied of all nanomaterials due to its wide range of useful properties.[1] A graphene sheet consists of an atomically thin array of $sp^2$ bonded carbon atoms organized in a planar hexagonal arrangement and was first produced and exploited in 2004 by Geim and Novosolov. However, they were only able to produce individual sheets of graphene by micromechanical cleavage of graphite.[2]

The novel electronic properties of graphene have been well documented.[1] In addition, graphene is ideal for a range of applications. For example, it is the strongest material known to man[3], has been fabricated into large area transparent conductors[4] and is extremely promising in the fields of composites, coatings and electronic devices. Because of these exciting properties, a number of new methods of graphene production have been developed such as by annealing SiC substrates[5] or growth on metal supports.[6]

These methods for producing graphene have been very successful to date. However, it is likely that many future industrial applications of graphene will be in sectors such as large-area coatings or composite fillers which require the production of graphene in very large quantities.[7] No methods currently exist which are scalable and give defect free graphene in large quantities. To this end, it is likely that liquid phase production methods will be required.[8]

Over the last number of years, many methods have been demonstrated to produce graphene (and more recently other 2-D materials) in reasonable quantities. The two main methods are chemical vapour deposition (CVD) and liquid exfoliation. CVD is a method that can be used to grow monolayers of graphene[4] or other 2D materials such as $MoS_2$[9] on surfaces, primarily for electronic applications. The typical masses deposited are ~$10^{-7}$ kg/m$^2$. However, many applications, such as the use of graphene as a filler in composites will require much larger masses, potentially many tonnes per year. In addition, the form of CVD graphene—a monolayer on a surface—is unsuitable for applications such as composites or porous electrodes. It is widely accepted that liquid exfoliation is the only method to produce graphene in a versatile form (micron sized flakes) in large quantities.

As discussed, graphite is just one member of a large family of layered crystals. The basic building block of such a crystal is an atomically thin sheet of material, named graphene in the case of graphite. These "nanosheets" are stacked on top of each other and bound by van der Waals forces. Between atoms or molecules, these forces are relatively weak. However, when integrated over the areas of nanosheets, these forces can be quite large. This makes it difficult to separate (or exfoliate) the nanosheets from their parent crystal. The most promising methods to do this tend to operate in a liquid environment—liquid exfoliation.

The most common method of exfoliating graphene is to oxidise graphite to create graphite oxide. Here oxygen containing groups are covalently bound to the graphene. This swells the crystal, weakening the binding energy between layers. It also allows water to intercalate between the layers which further weakens the binding, ultimately allowing exfoliation[10]. The oxide groups can be removed by reduction either chemically or thermally[11]. The problem is that the graphene produced by this method is very defective. It always contains missing atoms or even holes in the nanosheets which severely distorts its mechanical and electrical properties to the extent that it cannot be considered graphene but only graphene-like. Thus, oxidisation cannot be used to develop a simple scalable method to produce defect free graphene.

Another method is based on intercalation of species such as ions between the layers of the crystal and has been widely applied to exfoliate layered materials including graphite[12], and $MoS_2$[13]. Intercalation, often of ionic species, increases the layer spacing, weakening the interlayer adhesion, and reducing the energy barrier to exfoliation. Intercalants such as n-butyllithium[13] or $IBr^{12}$ can transfer charge to the layers, resulting in a further reduction of interlayer binding. Subsequent treatment such as thermal shock[12] or ultrasonication[13] in a liquid completes the exfoliation process. The exfoliated nanosheets can be stabilised electrostatically by a surface charge[13b] or by surfactant addition[12]. In the case of $MoS_2$, this method tends to give highly exfoliated nanosheets but has drawbacks associated with its sensitivity to ambient conditions[13a]. The real disadvantage here is that this process contains multiple steps (intercalation followed by exfoliation). Crucially, the intercalation step is slow, sensitive to ambient conditions and not scalable. Thus, intercalation cannot be used to develop a simple, scalable method to produce defect free graphene (or other 2D materials).

Another method has been developed by one of the inventors. It involves the ultrasonication of a layered crystal such as graphite[14] or $MoS_2$ in a suitable solvent[15] or aqueous surfactant solution[16]. Here the high level of ultrasonic power (~300 W) being dissipated in a small volume of liquid (~100 ml) results in a very high power density (~3000 W/L). The energy dissipated acts to break up the crystal into individual nanosheets. However, this process cannot give true exfoliation unless the nanosheets are stabilised against reaggregation. This is achieved either by choosing special solvents which stabilise the exfoliated nanosheets by interacting with their surface[14-15] or by sonicating in a water-surfactant or water-polymer mixture. The surfactant molecules (or ions in some cases) or polymer chains stick to the nanosheets surface stabilising them against reaggregation. This method has considerable advantages as it is known to produce defect free graphene in one step. The problem with this method is the high energy density required for ultrasonic exfoliation. Using typical ultrasonic processors, high power densities can only be achieved in small liquid volumes. This means that the only way to scale-up the process is to increase the number of processors used. Thus the cost scales linearly with the amount of graphene (or other 2-D nanosheets) produced. Thus, this method cannot achieve any economies of scale and so is not a candidate as a simple scalable method to produce defect free graphene.

International Pamphlet Publication No. WO 2011/014347 A1 mentions the use of shear mixing, but only when outlining alternative approaches involving intercalation or graphite oxide routes. Chinese Patent Application No. CN 101671015 A describes a process that involves the use of ball milling, followed by a sonication step. Similarly, Chinese Patent Application No. CN 102583350 A describes processing a graphite-liquid mixture in a "gear group" which is used to feed the mixture into a sonication step. Furthermore, UK Patent Application No. GB 2483288 A describes a process for exfoliating layered materials from the bulk crystal. The process described used sonication only for exfoliation in water/surfactant solution.

Another exfoliation method that has been used is ion intercalation followed by shear mixing. In this method, ions are intercalated between the layers of the layered crystal. As described above, intercalation increases the layer spacing, weakening the interlayer adhesion, and reducing the energy barrier to exfoliation. This is a critically important step. This weakening of the forces binding the layers together is generally thought to be critical to facilitate exfoliation. Once this has been achieved, the swelled layered crystallites e.g. vermiculite[17], $TaS_2$[18], graphite (U.S. Pat. Nos. 5,186,919; 8,132,746), can be exfoliated using a process called shear mixing. In this process, an impellor or rotor/stator combination rotates at high speed in the liquid containing the layered crystal. This results in turbulent flow which can act to exfoliate the layered crystal. The main advantage of this technique is mixing using impellors or rotor/stators is known to be potentially scalable to industrial levels (depending on the components being mixed). However, there is a serious drawback. The requirement that ion intercalation must be carried out to weaken the bonds between layers means that the process is neither simple (not one-step) nor scalable (the intercalation process is slow, sensitive to ambient conditions and not easily or cheaply scalable). In addition, the presence of residual ions may degrade the properties of the graphene and so effectively acts as a contaminant. This pre-treatment can be time consuming, expensive, require special reaction conditions and limit the possibility for industrial scale-up.

It is worth considering whether the intercalation step is required. For a standard bench-top high-shear mixer (e.g. the Silverson L5M) the maximum power output is ~250 W. These are typically used to mix ~liter sized volumes (mixing is inefficient at low volumes). This means the dissipated power density is <250 W/L. This is a factor of ~10 below the figure quoted above for ultrasonication. Thus, the received wisdom would imply that shear mixing should not be powerful enough to break the bonds connecting the nanosheets in layered crystals unless these bonds have been weakened by a process such as intercalation. Thus, because of the limits associated with ion intercalation, ion intercalation coupled with shear mixing is not a candidate as a simple scalable method to produce defect free graphene or other nanosheets.

There is one paper that described the exfoliation of graphite to give graphene using shear mixing[17]. Alhassan and co-workers used a stirred impeller style of mixer with turbulent flow to attempt to exfoliate graphene in water and laponite, an additive which has rapid gelation kinetics. They showed that if water or water and surfactant solution in the absence of laponite are used then the graphene rapidly aggregates and sediments. While the authors do show evidence of graphene exfoliation, they note that in the absence of a stabilising solvent or surfactant, aggregation and sedimentation of the graphitic material will occur. As such the message from this paper is that graphene cannot be made by shear mixing of graphite in liquids. In fact the only way aggregation could be prevented was by the addition of laponite clay (these are planar nanoparticles which can be exfoliated in water), which sets as a solid gel when added to water. There is no observation of exfoliated graphene in the absence of laponite. Mixing was always carried out in the presence of laponite.

Laponite is a clay which consists of charged 2-dimensional nanosheets. The charge is compensated by mobile counterions which exist between the layers. As with ion exfoliation, these counterions mean that laponite should be easily exfoliated in water using a shear mixer. On exfoliation, the mobile counterions will be distributed throughout the liquid, especially at the high clay concentrations used in this work. This means that there are many ionic species available to intercalate between the graphene layers, thus weakening the interlayer interaction and facilitating exfoliation. Thus, it is likely that the presence of laponite is necessary to allow graphite exfoliation. The exfoliated graphene is kinetically stabilised against reaggregation by being embedded in solid polymer or by adding gelling clay material (see U.S. Pat. No. 7,906,053 and (14), respectively).

The problem here is that once the graphene is mixed with the clay, it is subsequently un-recoverable. Thus, this method, although it produced graphene, cannot be used as a graphene production method and it is probable that the graphene cannot be produced in the absence of the clay. Thus, clay addition, prevents both processing and collection of the exfoliated graphene.

It is an object of the present invention to overcome at least one of the above-mentioned problems.

SUMMARY OF THE INVENTION

Many methods to exfoliate layered crystals in liquids have been demonstrated, with most of the work focusing on graphene. However, none of the methods described have all the properties needed to qualify as an industrially scalable, one-step method to produce defect free graphene and other 2-dimensional nanomaterials.

According to the present invention there is provided, as set out in the appended claims, a process for exfoliating untreated 3-dimensional layered material to produce a 2-dimensional material, said process comprising the steps of:
mixing the untreated layered material in a liquid to provide a mixture;
applying shear force to said mixture to exfoliate the 3-dimensional layered material and produce dispersed exfoliated 2-dimensional material in solution; and
removing the shear force applied to said mixture, such that the dispersed exfoliated 2-dimensional material remains free and unaggregated in solution.

In one embodiment, there is provided a process for exfoliating untreated 3-dimensional layered material to produce a 2-dimensional material, said processes comprising the steps of:
mixing the untreated 3-dimensional layered material in a liquid to provide a mixture; and
applying shear force to said mixture to exfoliate the 3-dimensional layered material and produce an exfoliated and dispersed 2-dimensional material which is free and unaggregated in solution.

The solution provided by the present invention to overcome the above-mentioned problems involves a process which results in the exfoliation of layered material and which process can be scaled up to produce quantities of exfoliated layered material, such as graphene, on a large (industrial) and commercial scale.

In the specification, the term "free" should be understood to mean that the exfoliated 2-dimensional material is neither encased in nor hindered by a gelling or thickening agent in the solution, such as for example laponite clay. The exfoliated 2-dimensional material is free to move in solution by Brownian motion. For example, the "free" nature of exfoliated graphene facilitates later collection of the exfoliated graphene for storage or further use.

In one embodiment of the invention, flakes of 2-dimensional material and 3-dimensional layered material may be removed from the solution by low-speed centrifugation, gravity settling, filtration or flow separation.

In one embodiment of the invention, the process may further comprise the step of allowing the formation of a thin film layer from said mixture. The step of forming the thin film layer may be formed by vacuum filtration or accelerated evaporation. It will be understood by those skilled in the art that other means may be used to form the thin film later, for example, by dip coating, Langmuir-Blodgett coating, spray coating, gravure coating, spin coating or other means.

Following the step of applying shear force the mixture comprises a dispersion of 2-dimensional atomic crystals, for example graphene. The layered material may be any 3-dimensional layered compound, for example graphite or any transition metal dichalcogenide having the formula $MX_n$, or any other layered material such as transition metal oxides, boron nitride (BN), $Bi_2Te_3$, $Sb_2Te_3$, TiNCl, $MoO_3$ or any other inorganic layered compound. When the 3-dimensional transition metal dichalcogenide has the formula $MX_n$, M may be selected from the group comprising Ti, Zr, Hf, V, Nb, Ta, Cr, Mn, Mo, W, Tc, Re, Ni, Pd, Pt, Fe and Ru; X may be selected from the group comprising O, S, Se, and Te; and $1 \leq n \leq 3$.

In one embodiment of the invention, the liquid may be a suitable solvent, a water-surfactant solution or a polymer-solvent solution. Suitably, the solvent may be selected from the group comprising n-methyl pyrrolidone (NMP), cyclohexylpyrrolidone, dimethyl formamide, Cyclopentanone (CPO), Cyclohexanone, N-formyl piperidine (NFP), Vinyl pyrrolidone (NVP), 1,3-Dimethyl-2-imidazolidinone (DMEU), Bromobenzene, Benzonitrile, N-methyl-pyrrolidone (NMP), Benzyl Benzoate, N,N'-Dimethylpropylene urea, (DMPU), gamma-Butrylactone (GBL), Dimethylformamide (DMF), N-ethyl-pyrrolidone (NEP), Dimethylacetamide (DMA), Cyclohexylpyrrolidone (CHP), DMSO, Dibenzyl ether, Chloroform, Isopropylalcohol (IPA), Cholobenzene, 1-Octyl-2-pyrrolidone (N8P), 1-3 dioxolane, Ethyl acetate, Quinoline, Benzaldehyde, Ethanolamine, Diethyl phthalate, N-Dodecyl-2-pyrrolidone (N12P), Pyridine, Dimethyl phthalate, Formamide, Vinyl acetate, Acetone etc. Preferably, the solution is neither a thickening agent nor gelling/gelation agent.

In one embodiment of the present invention, the water-surfactant solution comprises a solution of water and a surfactant selected from the group comprising sodium cholate (NaC), sodium dodecylsulphate (SDS), sodium dodecylbenzenesulphonate (SDBS), lithium dodecyl sulphate (LDS), deoxycholate (DOC), taurodeoxycholate (TDOC), polyoxyethylene (40) nonylphenyl ether, branched (IGEPAL CO-890® (IGP)), polyethylene glycol p-(1,1,3,3-tetramethylbutyl)-phenyl ether (Triton-X 100® (TX-100)).

In one embodiment, the ratio of the concentration of the surfactant in the water-surfactant solution to the three-dimensional material for use in the process is between 1:400 and 1:50, for example, 1:400, 1:350, 1:300, 1:250, 1:200, 1:100, 1:75, 1;50; and with a ratio between 1:400 and 1:300 preferred, for example, 1:390, 1:380, 1:375, 1:370, 1:360, 1:350, 1:340, 1:330, 1:320, 1:310, 1:300.

In one embodiment of the present invention, the polymer-solvent solution comprises a solution of a polymer selected from the group comprising polyvinyl alcohol (PVA), Polybutadiene (PBD), Poly(styrene-co-butadiene) (PBS), Polystyrene (PS), Polyvinylchloride (PVC), Polyvinylacetate (PVAc), Polycarbonate (PC), Polymethylmethacrylate (PMMA), Polyvinylidene Chloride (PVDC) and Cellulose Acetate (CA). The polymer can be dissolved in any appropriate solvent.

In one embodiment, the exfoliated 2-dimensional material is concentrated and washed using cross-flow or tangential filtration. In the specification, the terms "cross-flow or tangential filtration" should be understood to mean a process for concentrating and washing exfoliated 2-dimensional dispersions by being passed tangentially across a filter membrane, which has a pressure-drop applied across it. This pressure-drop supplies the driving force for the liquid to pass through, while the fluid flow prevents the particles from blocking the pores of the membrane.

In one embodiment, the process may further comprise the step of inserting the exfoliated 2-dimensional material into a matrix to form a composite. Suitably, the matrix is a polymer or copolymer selected from the group comprising a thermoplastic, a thermoset, an elastomer or a biopolymer.

In one embodiment of the present invention, the shear force may be applied for any suitable time, for example, from 30 seconds to 600 minutes, from 1 minute to 300 minutes, preferably from 30 minutes to 240 minutes, more preferably from 30 minutes to 180 minutes, and ideally about 30 minutes to 120 minutes. This gives graphene dispersions at concentrations of about 0.001-1 mg/ml after about 60 minutes.

In one embodiment, the energy may be applied for 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, 50, 51, 52, 53, 54, 55, 56, 57, 58, 59, or 60 minutes. This may be repeated as often as the user wishes, for example, repeated once, twice, three-times, four-times etc. until the desired quantity of exfoliated material is acquired.

In a further embodiment of the invention, there is provided a process for exfoliating untreated 3-dimensional graphite to produce 2-dimensional, substantially non-oxidised graphene, said process comprising the steps of:
  mixing the untreated graphite in a liquid to provide a mixture;
  applying shear force to said mixture to exfoliate the 3-dimensional graphite and produce dispersed exfoliated 2-dimensional graphene; and
  removing the shear force applied to said mixture, such that the dispersed exfoliated 2-dimensional graphene remains free and unaggregated in solution.

In the specification, the term "substantially non-oxidised" should be understood to mean that the exfoliated 2-dimensional material, for example graphene, is produced using no reactive or oxidative chemistries so that the 2-dimensional product is substantially pristine and non-oxidised. The physical properties of the product remain unchanged.

The solution provided by the present invention to overcome the above-mentioned problems involves a process which results in the exfoliation of graphite and which process can be scaled up to produce quantities of exfoliated graphene, on a large (industrial) and commercial scale.

In one embodiment, the process may further comprise the step of inserting the graphene into a matrix to form a composite. Suitably, the matrix is a polymer or copolymer selected from the group comprising a thermoplastic, a thermoset, an elastomer or a biopolymer.

In one embodiment of the invention, the exfoliated graphene produced by the process of the present invention may be used for the mechanical reinforcement of polymers, to reduce the permeability of polymers, to enhance the conductivity (electrical and thermal) of polymers, and to produce transparent conductors and electrode materials.

The term "polymer" in the specification should be understood to mean a large molecule (macromolecule) composed of repeating structural units. These subunits are typically connected by covalent chemical bonds. Although the term "polymer" is sometimes taken to refer to plastics, it actually encompasses a large class comprising both natural and synthetic materials with a wide variety of properties. Such polymers may be thermoplastics, elastomers, or biopolymers.

The term "copolymer" should be understood to mean a polymer derived from two (or more) monomeric species, for example a combination of any two of the below-mentioned polymers. An example of a copolymer, but not limited to such, is PETG (Polyethylene Terephthalate Glycol), which is a PET modified by copolymerization. PETG is a clear amorphous thermoplastic that can be injection moulded or sheet extruded and has superior barrier performance used in the container industry.

The term "thermoset" should be understood to mean materials that are made by polymers joined together by chemical bonds, acquiring a highly cross-linked polymer structure. The highly cross-linked structure produced by chemical bonds in thermoset materials is directly responsible for the high mechanical and physical strength when compared with thermoplastics or elastomers materials.

In one embodiment of the present invention, the polymer is a thermoplastic which may be selected from, but not limited to, the group comprising acrylonitrile butadiene styrene, polypropylene, polyethylene, polyvinylchloride, polyamide, polyester, acrylic, polyacrylic, polyacrylonitrile, polycarbonate, ethylene-vinyl acetate, ethylene vinyl alcohol, polytetrafluoroethylene, ethylene chlorotrifluoroethylene, ethylene tetrafluoroethylene, liquid crystal polymer, polybutadiene, polychlorotrifluoroehtylene, polystyrene, polyurethane, and polyvinyl acetate.

In one embodiment of the present invention, the polymer is a thermoset which may be selected from, but not limited to, the group comprising vulcanised rubber, Bakelite (polyoxybenzylmethylenglycolanhydride), urea-formaldehyde foam, melamine resin, polyester resin, epoxy resin, polyimides, cyanate esters or polycyanurates, silicone, and the like known to the skilled person.

In one embodiment of the present invention, the polymer is an elastomer which may be selected from, but not limited to, the group comprising Polybutadiene, butadiene and acrylonitrile copolymers (NBR), natural and synthetic rubber, polyesteramide, chlorpoene rubbers, poly(styrene-b-butadiene) copolymers, polysiloxanes (such as Polydimethylsiloxane (PDMS)), polyisoprene, polyurethane, polychloroprene, chlorinated polyethylene, polyester/ether urethane, poly ethylene propylene, chlorosulphanated polyethylene, polyalkylene oxide and mixtures thereof.

In one embodiment of the present invention, the polymer is a biopolymer which may be selected from, but not limited to, the group comprising Gelatin, Lignin, Cellulose, Polyalkylene esters, Polyvinyl alcohol, Polyamide esters, Polyalkylene esters, Polyanhydrides, polylactide (PLA) and its copolymers and polyhydroxyalkanoate (PHA).

In one embodiment of the present invention, the polymer is a copolymer selected from, but not limited to, the group comprising copolymers of propylene and ethylene, Acetal copolymers (Polyoxymethylenes), Polymethylpentene Copolymer (PMP), Amorphous copolyester (PETG), acrylic and acrylate copolymers, polycarbonate (PC) copolymer, Styrene block copolymers (SBCs) to include Poly(styrene-butadiene-styrene) (SBS), Poly(styrene-isoprene-styrene) (SIS), Poly(styrene-ethylene/butylene-styrene) (SEBS), Ethylene vinyl acetate (EVA) and ethylene vinyl alcohol copolymer (EVOH) amongst others.

In another embodiment there is provided a 2-dimensional material produced by the process as described above.

In another embodiment of the present invention, there is provided a device comprising exfoliated layered material produced by the process described above. For example, the device may be a thin film of graphene on a substrate, or the device may be a component coated by graphene.

In one embodiment, the device may comprise a mixture of graphene produced by the process described above and another nano-material. Suitably, the nano-material is selected from the group comprising nanosheets, exfoliated inorganic layered compounds, carbon nanotubes, nanowires, nanoparticles etc.

In one embodiment, the device may be selected from, but not limited to, the group comprising electrodes, transparent electrodes, capacitors, transistors, solar cells, dye sensitised solar cells, light emitting diodes, thermoelectric devices, dielectrics, batteries, battery electrodes, capacitor, super capacitors, sensors (for example, chemical and biological sensors), nano-transistors, nano-capacitors, nano-light emitting diodes, and nano-solar cells.

In one embodiment of the invention, there is provided a dye-sensitised solar cell electrode comprising exfoliated graphene or other layered compounds produced by the process described above.

In the specification, the term "shear force" should be understood to mean the result of an impellor, propeller or blade rotating in a liquid such that a non-zero shear rate is developed. Standard commercially available mixing equipment is suitable for use in scaling-up production of exfoliated 2-dimensional material from a 3-dimensional layered material. The shear force may produce either turbulent or lamellar (laminar flow) mixing. The advantage of laminar flow mixing is that the less power is required to produce it (and hence less cost expended).

In one embodiment, the shear force generated produces a shear rate greater than $1000\ s^{-1}$, preferably greater than $2000\ s^{-1}$, and more preferably greater than $3000\ s^{-1}$.

In the specification, the term "untreated 3-dimensional layered material" should be understood to mean starting material, for example graphite, which is not treated in any way prior to applying the starting material to the process of the present invention so as to produce exfoliated 2-dimensional material, for example graphene.

In the specification, the term "low-speed centrifugation" should be understood to mean rotation of the dispersion in a centrifuge followed by the separation of supernatant from sediment. Typical rotation rates are 300-10000 rpm. However it can also mean leaving the sample to stand under gravity, resulting in the sedimentation of unexfoliated graphite. Again the sediment can be removed after a suitable settling time. Other alternative techniques can also be used such as flow separation or cross-flow filtration.

In the specification, the term "substantially non-oxidised graphene" should be understood to mean graphene to which covalently bonded oxides have not been attached. Such material retains the pristine $sp^2$ hybridised structure of pure graphene. As such this material will have the properties of pure graphene.

BRIEF DESCRIPTION OF THE DRAWINGS

The invention will be more clearly understood from the following description of an embodiment thereof, given by way of example only, with reference to the accompanying drawings, in which:—

DETAILED DESCRIPTION OF THE DRAWINGS

Figure 1:
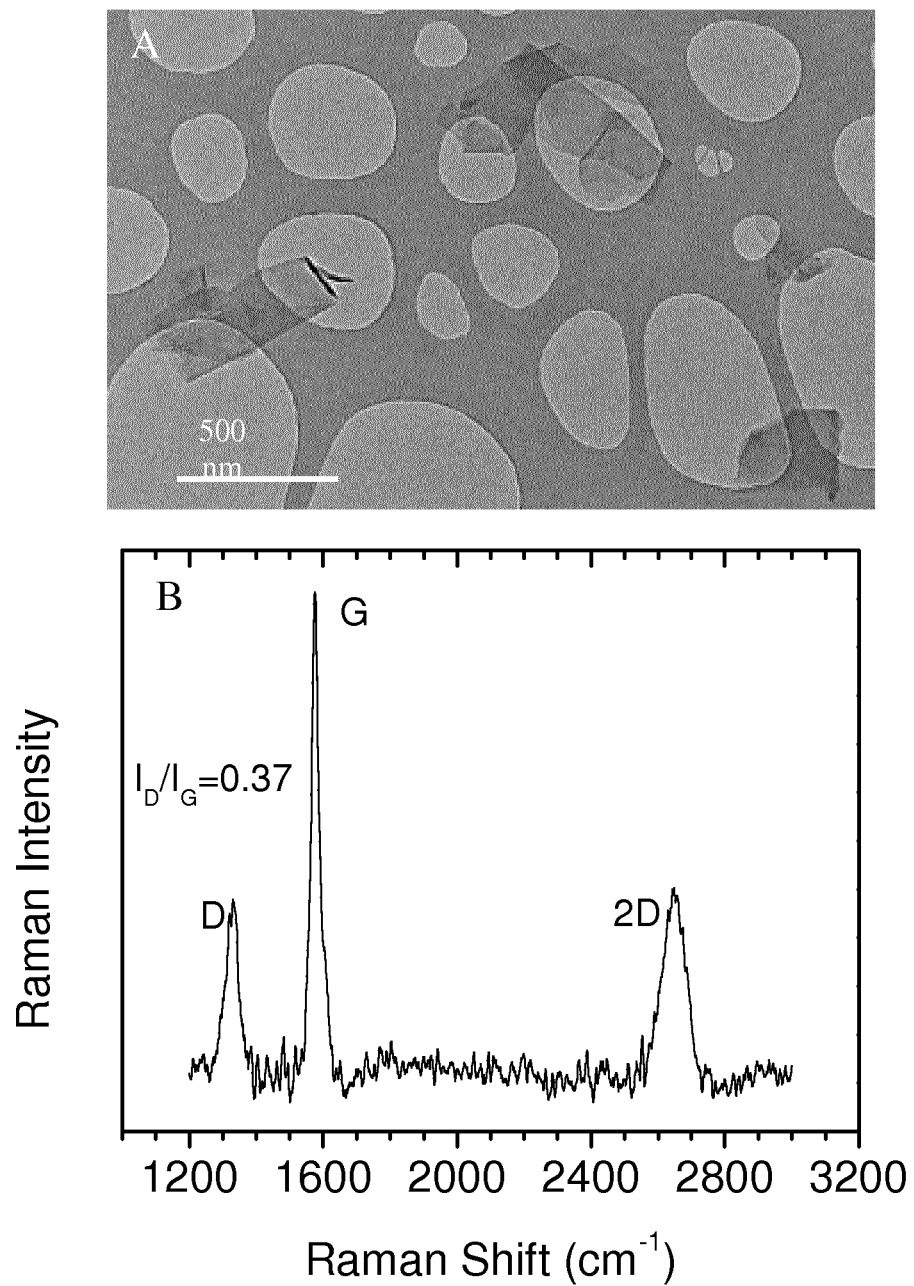
FIG. 1 A) TEM images of graphene flakes produced using the Silverson mixer (NMP as solvent). Mixing time=30 min, volume=3 L, Ci=80 mg/ml, N=7000 rpm. B) Typical Raman spectrum for graphene flakes produced using the Silverson mixer–t=30 min, Ci=80 mg/ml, N=3200 rpm, V=1500 ml.

For some years, it has been realised that exfoliated graphene and other layered materials would be required in large quantities for applications such as composites. The current invention addresses the problem of providing a simple, scalable process for exfoliated 2-dimensional layered compounds, such as, for example, MoS2 and graphene production.

For an exfoliated 2-dimensional layered compound such as graphene, the process takes pure (untreated) graphite as an example. The process clearly demonstrates that it can produce graphene in a usable form with no pre-treatments of the graphite, removing the need for complex and/or hazardous chemistry steps. The technique is known to be highly scalable, allowing large volumes to be processed. In essence, the invention provides a one step, industrially scalable, method of producing defect free graphene.

This invention provides a fast, simple and high yielding process for separating 3-D graphite into individual 2-dimensional graphene layers or flakes, which do not reaggregate. This process can be achieved without using hazardous solvents. The exfoliated graphene can be formed into thin films or composites, quickly, inexpensively and easily from liquid dispersions.

Exfoliated graphene is an ideal building block for electronic devices. For example, in thin film form they can be used for electrodes or transparent electrodes in displays, windows, capacitors, solar cells, light emitting diodes, batteries or super-capacitors etc.

Where the exfoliated graphene is in individual flake form they can be used for:
  (i) electrodes in nanoscale devices such as nano-transistors, nano-capacitors, nano light emitting diodes, nano solar cells, etc.;
  (ii) active layers in nano-devices such as nano transistors When embedded in a matrix of polymer (or other material e.g. metals such as Al or Ti) the exfoliated graphene can enhance the mechanical, electrical, thermal or barrier (i.e. gas/vapour impermeability) properties.

In order to exfoliate graphene flakes using the process of the present invention, tests were performed to determine if graphite could be exfoliated to graphene in liquids (using the solvent NMP, water surfactant and water polymer solutions). Two different types of mixer were used, a rotor stator high shear mixer (Silverson L5M) and a tank containing a high speed impeller (a Kenwood kitchen blender Model BL 370).

The Silverson L5M mixer is a rotor-stator high shear, fitted with a standard mixing head and square-hole high shear screen. The rotor comprises 4 blades with a diameter of 31.2 mm and thickness of 5.1 mm. The square-hole high shear screen has an inner diameter of 31.5 mm and a thickness of 1.75 mm, giving a gap between the blades and the screen of 0.15 mm. The screen has 96 square holes of 2 mm side, arranged in four rows. The rotor has a maximum rotational speed of 8000 rpm, falling to 6000 rpm under full load (for high viscosity liquids), variable continuously in 100 rpm intervals.

Using this mixer, it has been clearly demonstrated herein that graphite can be exfoliated in liquids to give large quantities of nanosheets. It has been demonstrated herein that this can be achieved in solvents such as NMP and in water surfactant or water-polymer solutions. However, for simplicity, the description below will focus on the exfoliation of graphite to give graphene in NMP.

Initial tests showed that mixing of graphite in ~1 L of NMP using the Silverson L5M gave a black liquid. This liquid was centrifuged at 1500 rpm for 90 minutes to remove any unexfoliated graphite. Subsequent microscopy analysis showed the centrifuged liquid to contain large quantities of exfoliated graphene nanosheets. TEM showed these to be very thin, with a thickness range of ~1 to ~10 monolayers and lengths of 500-800 µm (see FIG. 1A). Raman spectra are shown in FIG. 1B. The most important features are the D band at ~1300 cm$^{-1}$ and the C band at ~1600 cm$^{-1}$. These bands are associated with defects and graphitic carbon respectively. The ratio of D to G band intensities is a measure of defect content and in this case is ~0.37. It has been shown that if the graphene flakes contain no basal plane defects but only edge defects, the lateral flake size, L, can be estimated from this ratio by:

$$I_D/I_G \sim 0.26/L \tag{1}$$

where L is in microns. The measured value of $I_D/I_G \sim 0.37$ then implies a value of L=0.7 µm. This is perfectly consistent with the measured flakes lengths (by TEM). Thus, the Raman spectra suggest the flakes to be free of basal plane defects and so of high quality.

Once confirmed that graphene can be produced in this fashion, the next step was to consider how much can be produced and what parameters control this. Graphite was mixed in the solvent NMP at a well-defined concentration ($C_i$) and treated using the mixer. Unexfoliated graphite was removed by centrifugation and the supernatant collected to give a graphene dispersion. The simplest way of measuring how much graphene is produced is to measure the absorbance per cell length, Abs/l, of the dispersion after centrifugation and use the Lambert-Beer law (Abs/l=$\alpha$C, in this study $\alpha$ was measured as 3778 (mg/ml)$^{-1}$m$^{-1}$) to give the dispersed concentration C (mass per volume). The dispersed concentration is expected to depend on the mixing time, t, the mixing speed (rotor speed in rpm), N, the rotor diameter, D, the liquid volume, V, the initial concentration of graphite added, $C_i$. From the literature, it is known that properties of mixtures produced by shear mixing tend to depend on such parameters as power laws[18]. Thus, the dispersed concentration, C, is expected to scale as:

$$C \propto C_i^\chi t^\tau N^\mu D^\delta V^\upsilon \quad (2)$$

The actual values of the exponents, $\chi$, $\tau$, $\mu$, $\delta$, $\upsilon$ will control whether the process is scalable.

Thus, it is critical to explore the dependence of dispersed concentration on each of the parameters above. The simplest parameter is the mixing time, t. A number of dispersions were produced with certain values of $C_i$, N, V and D but for a range of mixing times. In all cases the dispersed concentration was measured. Two examples of this sort of data are found in FIG. 2A. This data clearly shows that the dispersed concentration, C, increases with mixing time, t, as a power law with exponent very close to ½ (i.e. $t^{1/2}$, fit lines). This behaviour was always observed although in some cases, the concentration tended to saturate above a certain time. This allows us to state that on average, the exponent for time is $\tau$=½ and so $$C = A\sqrt{t} \quad (3)$$

$$\text{where } A \propto C_i^\chi N^\mu D^\delta V^\upsilon \quad (4).$$

Figure 2:
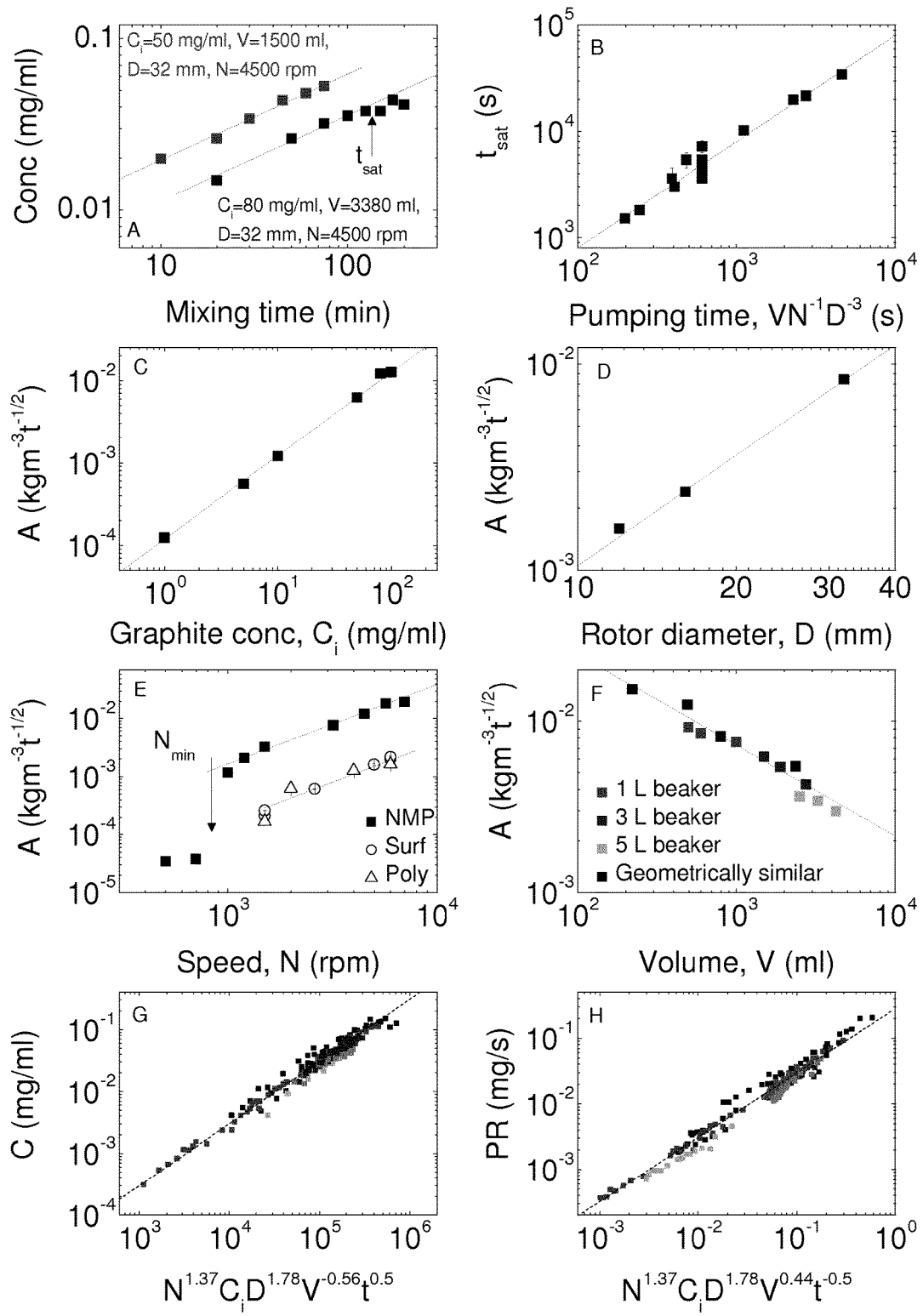
FIG. 2 This figure outlines data related to the concentration of graphene prepared by treating graphite immersed in the solvent NMP (and in one case two other liquids) using a Silverson mixer. Graphene dispersions were prepared while varying the following parameters: mixing time, t; graphite concentration, $C_i$; rotor diameter, D; rotor speed (rpm), N; volume of mixing vessel, V. A) Dispersed concentration, C, plotted as a function of mixing time, t. Note the lines denote behaviour of the type: $C=At^\tau$ where $\tau$ is always close to 0.5. In some cases, the linear behaviour is observed only over a limited range with the concentration saturating after a given time, $t_{sat}$. B) Graph of the measured values of $t_{sat}$ plotted versus $VN^{-1}D^{-3}$. Linearity implies that the concentration saturates after all the liquid in the vessel has been pumped through the rotor a certain number of times. C) Values of A [from $C=At^\tau$], found by fitting data such as in FIG. 2A, plotted against graphite concentration, $C_i$. D) Values of A plotted against rotor diameter D. E) Values of A plotted against mixing speed, N. Also shown is data for graphene prepared by mixing graphite in a water-surfactant solution and a water-polymer solution. F) Values of A plotted against liquid volume. G) Graphene concentration and H) graphene production rate plotted against a composite variable indicating that all data follows the scaling laws discussed in the text.

In these experiments, the concentration vs. mixing time was measured for a wide range of combinations of N, D, V and $C_i$. On at least 13 occasions, the concentration tended to saturate after a certain time, $t_{sat}$. It was found that $t_{sat}$ scaled linearly with the combination $VN^{-1}D^{-3}$ (FIG. 2B). Linearity implies that the concentration saturates after all the liquid in the vessel has been pumped through the rotor a certain number of times.[19] This time ($t_{sat}$) represents a maximum mixing time above which no further graphene can be produced.

The dependence of concentration on time for a range of other parameters (N, V, $C_i$, D) was then measured. In most cases (except where noted) the solvent was NMP. In all cases, approximately square root behaviour was found (at least for short mixing times), the data fitted and A calculated. In general, the following parameters were used with one parameter being varied at a time: N=4500 rpm, $C_i$=50 mg/ml, V=1500 ml and D=3.1 cm. A was found from the concentration vs. time data for each value of the varying parameter.

In one set of experiments, the following parameters were kept: N=4500 rpm, V=1500 ml and D=3.1 cm while $C_i$ and mixing time were varied. From each set of time dependent data, A was calculated. FIG. 2C shows A as a function of graphite concentration. This graph shows linear behaviour i.e. C$\propto C_i$ (this indicates that $\chi$ from eq2=1).

In one set of experiments, the following parameters were kept: N=4500 rpm, $C_i$=50 mg/ml and V=1500 ml, while D and mixing time were varied. From each set of time dependent data, A was calculated. FIG. 2D shows A as a function of rotor diameter, D. This graph shows power law behaviour i.e. C$\propto D^{1.78}$ (this indicates that $\delta$ from eq2=1.78).

In one set of experiments, the following parameters were kept: $C_i$=50 mg/ml, V=1500 ml and D=3.1 cm, while N and mixing time were varied. From each set of time dependent data, A was calculated. The black squares in FIG. 2E show A as a function of rotor speed, N (in rpm). This graph shows an initial steep increase followed by power law behaviour i.e. C$\propto N^{1.37}$ (this indicates that $\mu$ from eq2=1.37). This steep increase shows that a minimum rotor speed, $N_{min}$, is necessary to exfoliate graphene.

In one set of experiments, the following parameters were kept: N=4500 rpm, $C_i$=50 mg/ml and D=3.1 cm, while V and mixing time were varied. From each set of time dependent data, A was calculated. FIG. 2F shows A as a function of liquid volume, V. These experiments were performed in a range of cylindrical vessels. Vessels of maximum capacity of 1, 3 and 5 L were studied when filled to varying liquid volumes. A range of other cylindrical vessels of varying capacity were studied while filled to a single liquid height, h, such that h was equal to the vessel diameter. Such a condition is known as geometric similarity. All data shows the same power law behaviour i.e. C$\propto V^{-0.56}$ (this indicates that D from eq2=-0.56).

The inventors have also demonstrated the production of graphene by mixing graphite in surfactant-water and polymer-water solutions. While the polymer polyvinyl alcohol dissolved in the solvent water was used, any soluble polymer dissolved in any appropriate solvent could be used. Ideally, the combination of solvent and polymer are chosen such that the Hildebrand solubility parameters of graphene, polymer and solvent are close (within ~4 MPa$^{1/2}$ of each other). Examples are solutions of the polymers polybutadiene (PBD), poly(styrene-co-butadiene) (PBS), polystyrene (PS), poly(vinylchloride) (PVC), poly(vinyl acetate) (PVAc), polycarbonate (PC), poly(methyl methacrylate) (PMMA), poly(vinylidenechloride) (PVDC), and cellulose acetate (CA) in solvents such as tetrahydrofuran (THF) or cyclohexanone. Also, while the surfactant used was sodium cholate dissolved in the solvent water, any surfactant could be used. In these experiments, for both polyvinylalcohol-water and sodium cholate-water solutions, the following parameters were kept: $C_i$=50 mg/ml, V=1500 ml and D=3.1 cm, while N and mixing time were varied. From each set of time dependent data, A was calculated. The open circles and triangles in FIG. 2E show A as a function of rotor speed, N (in rpm) for the surfactant and polymer stabilised dispersions respectively. This graph shows power law behaviour in both cases with the same exponent as observed for NMP dispersions i.e. C$\propto N^{1.37}$.

The data above shows that $$C \propto C_i^{1/2} N^{1.37} D^{1.78} V^{-0.56} \quad (5)$$

This can be tested by plotting all the collected data for concentration versus $C_i^{1/2}N^{1.37}D^{1.78}V^{-0.56}$. Here all data sits on a single master curve which extends over 3 orders of magnitude (FIG. 2G). This confirms that the measured scaling behaviour is general and holds over a wide range of parameters.

However, a more interesting parameter than concentration is the graphene production rate (or any exfoliated 2-dimensional material production rate). This is defined as:

$$P = VC/t \quad (6)$$

This means that $P \propto C_i^\chi t^{\tau-1} N^\mu D^\delta V^{\upsilon+1}$ (7a)

Taking the exponents measured above, it can be written that:

$$P \propto C_i^{-1/2} N^{1.37} D^{1.78} V^{0.44} \quad (7b)$$

If this is correct, all of the data presented here should sit on the same straight line when P is plotted versus $C_i t^{-1/2} N^{1.37} D^{1.78} V^{0.44}$. This is shown to be the case in FIG. 2D. This demonstrates, for the first time, the characterisation of the scalability of graphene production rate with mixing parameters.

Shear Exfoliation of Other Layered Compounds

As an example of exfoliating a further 3-dimensional layered compound, the transition metal dichalcogenide (TMD) $MoS_2$ was used. The process takes pure (untreated) powdered $MoS_2$ (a layered crystal), and uses it to produce nanosheets of exfoliated $MoS_2$ in a usable form with no pre-treatments, removing the need for complex and/or hazardous chemistry steps. The technique has been demonstrated to be highly scalable, allowing large volumes to be processed. In essence, the invention provides a one step, industrially scalable, method of producing individual nanosheets, which do not reaggregate. This process can be achieved without using hazardous solvents. The exfoliated $MoS_2$ can be formed into thin films or composites, quickly, inexpensively and easily from liquid dispersions. While $MoS_2$ is used as an example, this process can be applied to a range of materials including BN, $WS_2$, $MoSe_2$, $TaS_2$, $PtTe_2$, $NbSe_2$, $VTe_2$, $MnO_2$, $Sb_2Te_3$, $Bi_2Te_3$ etc.

In order to exfoliate $MoS_2$ flakes using the process of the present invention, tests were performed to determine if layered $MoS_2$ crystals could be exfoliated to $MoS_2$ nanosheets in liquids (using the solvent NMP, although other suitable solvents could be used). A rotor stator high shear mixer (Silverson L5M) was used in this study, as described above for the example of graphene.

Figure 3:
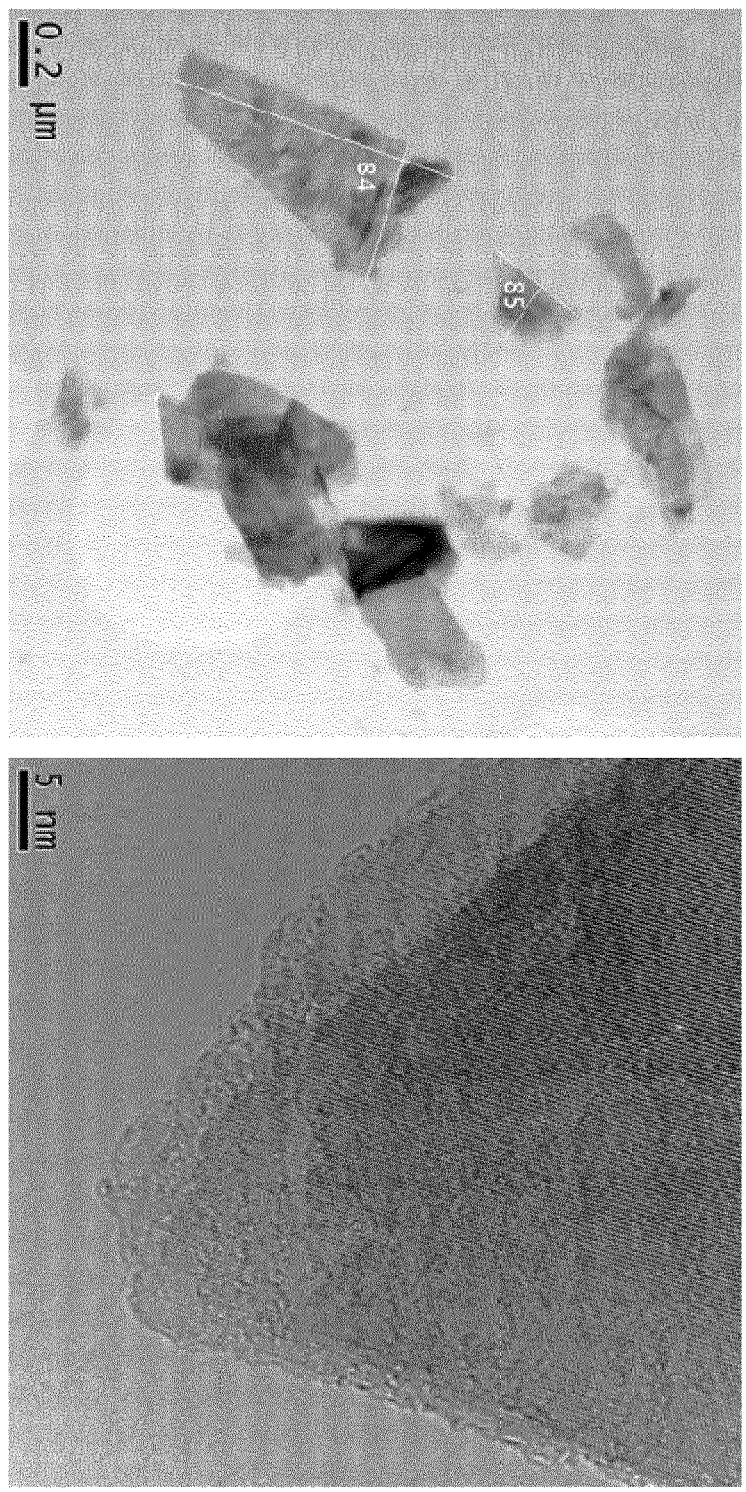
FIG. 3 TEM images of $MoS_2$ flakes produced using the Silverson mixer (NMP as solvent). Mixing time=5 min, volume=2 L, Ci=50 mg/ml, N=4000 rpm.

Mixing is achieved by adding the powdered $MoS_2$ to the solvent (NMP) in a large beaker (2500 ml). The mixing head is inserted into the beaker and the shear applied for a pre-determined time. Initial tests showed that mixing of layered crystals in ~2 L of NMP using the Silverson L5M gave a black liquid. This liquid was centrifuged at 1500 rpm for 90 minutes to remove any unexfoliated layered crystals. Subsequent microscopy analysis showed the centrifuged liquid to contain large quantities of exfoliated $MoS_2$ nanosheets. TEM showed these to be very thin, with a thickness range of ~1 to ~10 monolayers and lengths of 300-1000 nm (see FIG. 3A). High resolution TEM showed the nanosheets to be of high quality (FIG. 3B).

Once confirmed that $MoS_2$ can be produced in this fashion, the next step was to consider how much can be produced and what parameters control this, as performed above for graphene. Layered $MoS_2$ crystals were mixed in the solvent NMP at a well-defined concentration ($C_i$) and treated using the mixer. Unexfoliated layered crystals were removed by centrifugation and the supernatant collected to give a dispersion of $MoS_2$ nanosheets. The simplest way of measuring how much $MoS_2$ is produced is to measure the absorbance per cell length, Abs/l, of the dispersion after centrifugation and use the Lambert-Beer law (Abs/l=$\alpha$C, in this study $\alpha$ was measured as 1190 (mg/ml)$^{-1}$m$^{-1}$) to give the dispersed concentration (mass per volume). The dispersed concentration is expected to depend on the mixing time, t, the mixing speed (rotor speed in rpm), N, the rotor diameter, D, the liquid volume, V, the initial concentration of layered crystals added, $C_i$. From the literature, it is known that properties of mixtures produced by shear mixing tend to depend on such parameters as power laws[18]. Thus, the dispersed concentration, C, is expected to scale as per equation (2) above (that is $C \propto C_i^\chi t^\tau D^\delta V^\upsilon$). The actual values of the exponents, $\chi$, $\tau$, $\mu$, $\delta$, $\upsilon$, will control whether the process is scalable, as demonstrated for graphene above.

Thus, it is critical to explore the dependence of dispersed concentration on each of the parameters above. The simplest parameter is the mixing time, t. A number of dispersions were produced with certain values of $C_i$, N, V and D but for a range of mixing times. In all cases the dispersed concentration was measured. Two examples of this sort of data are found in FIG. 4A. This data clearly shows that the dispersed concentration, C, increases with mixing time, t, as a power law with exponent very close to ½ (i.e. $t^{0.56}$, fit line).

The dependence of concentration on time for a range of other parameters (N, V, $C_i$, D) was then measured. In all cases the solvent was NMP. In general, the following parameters were used with one parameter being varied at a time: N=4000 rpm, $C_i$=50 mg/ml, V=2000 ml, t=5 minutes and D=3.1 cm.

Figure 4:
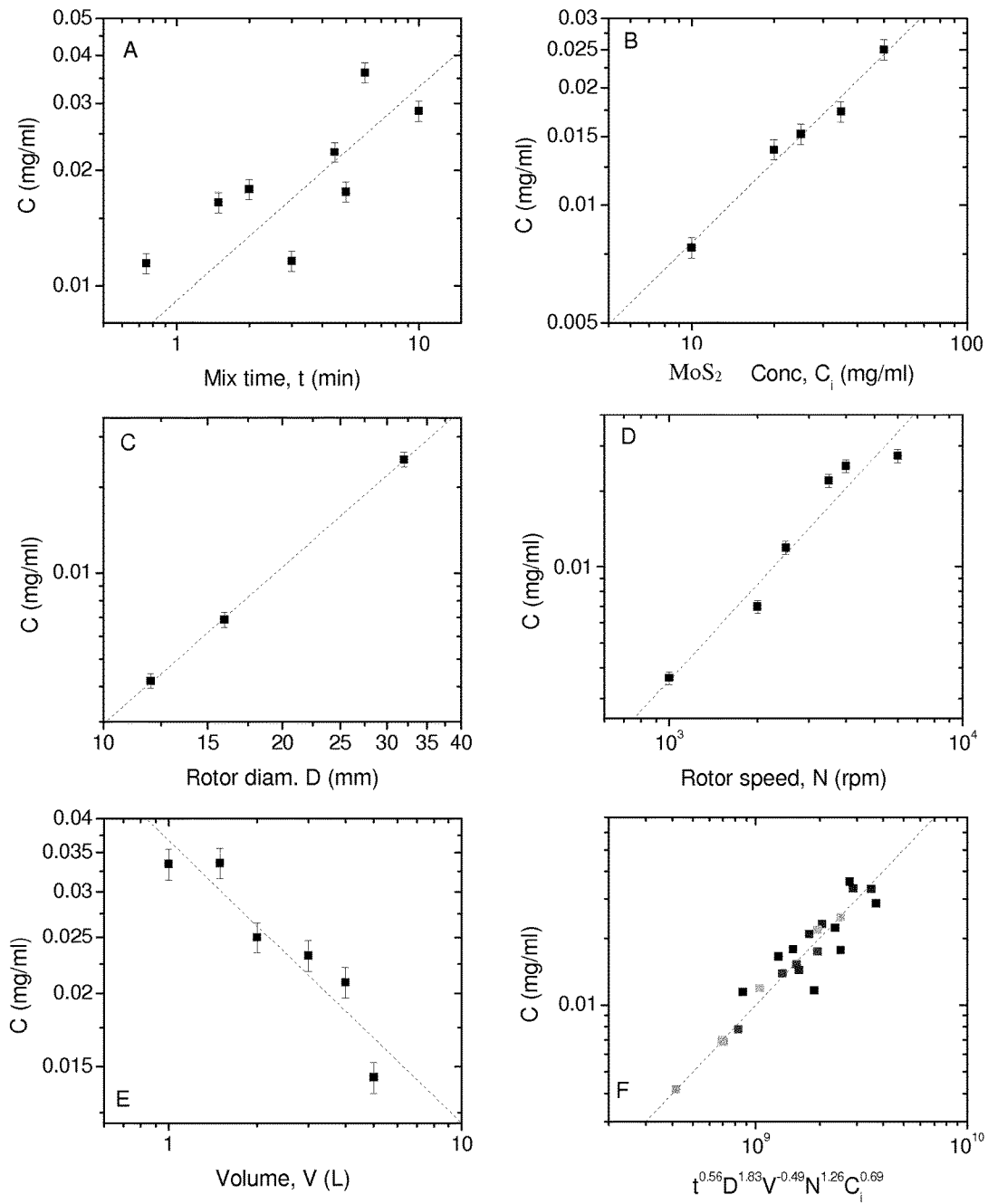
FIG. 4 This figure outlines data related to the concentration of exfoliated $MoS_2$ prepared by treating powdered $MoS_2$ immersed in the solvent NMP using a Silverson mixer. $MoS_2$ dispersions were prepared while varying the following parameters: mixing time, t; layered crystals concentration, $C_i$; rotor diameter, D; rotor speed (rpm), N; volume of mixing vessel, V. A) Dispersed concentration, C, plotted as a function of mixing time, t. B) Values of C plotted against layered crystals concentration, $C_i$. C) Values of C plotted against rotor diameter D. D) Values of C plotted against mixing speed, N. E) Values of C plotted against liquid volume. F) $MoS_2$ concentration plotted against a composite variable indicating that all data follows the scaling laws discussed in the text.

In one set of experiments, the following parameters were kept: N=4000 rpm, V=2000 ml, D=3.1 cm and t=5 minutes while $C_i$ was varied. FIG. 4B shows C as a function of layered crystals concentration. This graph shows power law behaviour i.e. $C \propto C_i^{0.69}$ (this indicates that $\chi$ from eq2=0.69).

In one set of experiments, the following parameters were kept: N=4500 rpm, $C_i$=50 mg/ml, t=5 minutes and V=1500 ml while D was varied. FIG. 4C shows C as a function of rotor diameter, D. This graph shows power law behaviour i.e. $C \propto D^{1.83}$ (this indicates that $\delta$ from eq2=1.83).

In one set of experiments, the following parameters were kept: $C_i$=50 mg/ml V=1500 ml, t=5 minutes and D=3.1 cm while N was varied. The black squares in FIG. 4D show C as a function of rotor speed, N (in rpm). This graph shows power law behaviour i.e. $C \propto N^{1.26}$ (this indicates that $\mu$ from eq2=1.26).

In one set of experiments, the following parameters were kept: N=4500 rpm, $C_i$=50 mg/ml, t=5 minutes and D=3.1 cm while V was varied. FIG. 4E shows C as a function of liquid volume, V. All data shows the same power law behaviour i.e. $C \propto V^{-0.49}$ (this indicates that $\upsilon$ from eq2=0.49).

The data above shows that $$C \propto C_i^{0.69} t^{0.56} N^{1.26} D^{1.83} V^{-0.49} \quad (8)$$

This can be tested by plotting all the collected data for concentration versus $C_i^{0.69} t^{0.56} N^{1.26} D^{1.83} V^{-0.49}$. Here all data sits on a single master curve (FIG. 4F). This confirms that the measured scaling behaviour is general and holds over a wide range of parameters.

However, a more interesting parameter than concentration is the $MoS_2$ production rate (or any exfoliated 2-dimensional material production rate). This is defined as per equation (6) above, namely:

$$P = VC/t \quad (6)$$

Applying equation 3 to the data shows that in this way, $MoS_2$ can be produced at a rate of 1.9 g/hr. This is considerably higher than what can be achieved by other methods.

$MoS_2$ is just one of many layered compounds. To show this method is general, a range of other layered compounds (BN, $WS_2$, $MoSe_2$ and $MoTe_2$) were exfoliated by shear mixing (see Table 1). In all cases, the solvent NMP was used. For each material, mixing was performed using a fixed set of mixing parameters: $C_i$=25 mg/ml, N=4000 RPM, D=32 mm, V=1000 ml, t=5 min. After mixing, the dispersion was centrifuged at at 1500 rpm for 90 minutes to remove any unexfoliated layered crystals. In all cases, coloured liquids were obtained indicating that material had been exfoliated. The supernatant was then filtered through a pre-weighed membrane and dried. Weighing then gave the mass of dispersed material and hence the dispersed concentration. The concentration of exfoliated BN was very high at 0.17 mg/ml. The other materials showed lower concentrations, close to 0.03 mg/ml. However, it should be noted that NMP is not an ideal solvent for these materials[15,20]. Using a more appropriate solvent should dramatically increase the dispersed concentration. Specifically, the solvents cyclohexylpyrrolidone and gamma-butyl-actone are appropriate for $WS_2$, $MoS_2$, $MoSe_2$ and $MoTe_2$.

TABLE 1

Results of tests on shear mixing of other layered compounds. The data shown are the liquid volume, mass of exfoliated material produced, exfoliated concentration and production rate. Mixing conditions: $C_i$ = 25 mg/ml, N = 4000 RPM, D = 32 mm, V = 1000 ml, t = 5 min.

| Material | Total mass (mg) | Conc. (mg/ml) | Rate (g/hr) |
|---|---|---|---|
| BN | 33.59 | 0.1679 | 0.4 |
| WS2 | 0.97 | 0.0028 | 0.01 |
| MoSe2 | 1.35 | 0.00397 | 0.016 |
| MoTe2 | 0.42 | 0.00131 | 0.005 |

Suitability for Scale-Up

Scaling analysis of the type described above is very important as it allows the prediction of the production rate as mixing parameters are changed e.g. during scale-up. During scale-up, it is probable that the rotor diameter will be increased linearly with the diameter of the mixing vessel. For a fixed vessel shape, this can be expressed as $D \propto V^{1/3}$. In addition, a typical mixing run will be stopped after $t_{sat}$, as minimal increases will be achieved thereafter. Because of the data in FIG. 2B, this means $t \propto V/ND^3$. Substituting these parameters into equation 7b shows that scale-up under these conditions will give a production rate of:

$$P \propto C_i V^{1.04} N^{1.78} \quad (9)$$

This equation is important as it shows that scale-up is possible. If this procedure is to be scalable, then the production rate must increase as the volume of the vessel (i.e. V) is increased, ideally faster than linearly. This will allow production to be increased simply by using bigger and bigger mixing tanks. Critically, the exponent on volume is >1 showing the production to scale slightly faster than linearly with the volume of the mixing vessel. This is the basis for achieving economy of scale. In addition, it shows that graphite concentration and rotor speed need to be maximised to maximise production rate.

The equation (7b) can be used to predict the attainable production rate on scale-up. A typical mixing run gave a production rate of 0.033 mg/s, for $C_i$=50 mg/ml, N=4500 rpm and V=1.5 L. Scaling up to a modest scale of V=3000 L, N=7000 rpm and C=100 mg/ml would give a production rate of, for example for graphene, 150 g/hr. For a 16 hr day, running 5 days per week, this will give ~0.5 tonne per year per mixing vessel.

Such scale-up is possible using of the shelf, commercially available mixing equipment. This is a considerable advantage for the implementation of any up-scaled exfoliation process.

Mechanism for Graphene Production

The data for graphene concentration as a function of rotor rpm, N, (FIG. 2E) clearly shows a minimum N below which very little graphene is formed. This can be understood by developing a simple model to describe the shear exfoliation of graphene. First we note that rather than using rotor speed N in rpm, a more fundamental parameter is shear rate, $\dot{\gamma}$, where $\dot{\gamma}=\pi ND/\Delta R$ ($\Delta R$ is rotor-stator gap). Henceforth, work will be done in terms of $\dot{\gamma}$.

Consider two square platelets, weakly bound and initially stacked on top of each other, being placed in a flowing fluid with non-zero shear rate. The velocity differential between the top and bottom of the sheets will result in an induced shear stress, $\sigma$. This may result in shear delamination.

The induced stress can be related to the induced force, F, by $F=\sigma L^2$. The applied stress is related to the shear rate by Newton's law: $\sigma=\eta\dot{\gamma}$ giving $F=\eta\dot{\gamma}L^2$ or $\dot{\gamma}=F/\eta L^2$ To assess the force, the energetics of the delamination process need to be considered. This situation can be analysed in terms of the interfacial energies which can be broken into three types; liquid-liquid (LL), liquid-platelet (LP), and platelet-platelet (PP).

Imagine the shear partially delaminates the sheets such that one sheet has slid a distance x relative to its initial stacked position. The energy, calculated from the sum of the interfacial energies is $$E(x) = -L[xE_{LL}+2(2L-x)E_{LP}+xE_{PP}]$$

where $E_{LL}$, $E_{PL}$ and $E_{PP}$ are areal interfacial bindings relating to the liquid-liquid, platelet-platelet and liquid platelet interfaces. The negative sign indicates that the interaction energies are negative, representing bound states. ($E_{LL}$, $E_{PL}$ and $E_{PP}$ are all positive quantities).

The minimum applied force for delamination can be estimated: $F_{min}=-\partial E(x)/\partial x$  $F_{min}=L[E_{LL}-2E_{LP}+E_{PP}]$ Using the geometric mean approximation, $E_{LP}=\sqrt{E_{LL}E_{PP}}$, gives $F_{min}=L[\sqrt{E_{LL}}-\sqrt{E_{PP}}]^2$ This permits an expression for a minimum shear rate for exfoliation of flakes of lateral size L to be written as:

$$\dot{\gamma}_{min} = \frac{[\sqrt{E_{LL}} - \sqrt{E_{PP}}]^2}{\eta L} \quad (10)$$

Here $E_{LL}$ and $E_{PP}$ can be thought of as the surface energies of the liquid and the platelet. The surface energy of the liquid must be distinguished from its surface tension. The liquid surface energy, $E_{LL}$, is related to the surface tension, $\Gamma$, by[21]:

$$\Gamma = E_{LL} - TS_{LL}$$

where $S_{LL}$ is the liquid surface entropy. The surface entropy is a generic liquid property that tends to have values in the range 0.07-0.14 mJ/m²K. Liquids of a given class tend to have very similar values of $S_{LL}$, with DMF and toluene for example shown to have values close to $S_{LL}$=0.11 mJ/m²K[22]. Thus, the universal value can be taken to be ~0.1 mJ/m²K. The surface tension of NMP is 40 mJ/m², which means the surface energy is 69 mJ/m² at room temperature.

From the data in FIG. 2E, $N_{min}$=1000 rpm so $\dot{\gamma}_{min}$=1×10⁴ s⁻¹. As reported below, the size of flakes exfoliated in the mixer at this shear rate (~800 rpm) is L~800 nm. Applying, eqn 10, this is consistent with a surface energy of graphene of ~67 or ~71 mJ/m². This is entirely consistent with the surface energy of graphene estimated from solvent exfoliation of graphite.[14,23]

It was noted that the mechanism described above requires only that the local shear rate is above a minimum value for exfoliation to occur. This can be the case for laminar or turbulent flow. This means that turbulence is not required for shear exfoliation of graphene.

FLAKE Length Measurements

TEM experiments were performed to determine how flake length depended on mixing parameters. A large number of dispersions were produced varying one parameter at a time while the other parameters took constant values from the following set: graphite concentration, $C_i$=50 mg/ml; mixing time, t=20 min; liquid volume, V=4.5 L; rotor speed, N=4500 rpm; rotor diameter, D=32 mm. For each of these dispersions, low resolution TEM micrographs (as discussed in section 3.1) were collected and the dimensions of 100 randomly chosen flakes were measured. It was also noted that the data may be slightly biased to larger flakes due to a portion of very small flakes falling through the holes in the TEM grid.

Shown in FIG. 9A is an example of a flake length histogram. These histograms are generally broad with flake lengths varying from, ~100 nm to ~3000 nm. From these histograms, we calculated the mean flake length. These data are plotted versus processing parameter in FIGS. 9B-F. Despite the inevitable scatter, in most cases, the flake length is roughly independent of the processing parameter. The most obvious deviation from this behaviour is the data where N was varied (FIG. 9F). Here, the flake length decreases with increasing N, appearing to saturate at L~500 nm for N>6000 rpm.

It is believed that the flake size is controlled by the mechanism described above. Equation (10) describes the minimum shear rate required to exfoliate flakes of a given size. However, if there are graphite crystallites present with a range of lateral sizes, it can be interpreted as describing the minimum flake size which can be exfoliated at a given shear rate:

$$L_{min} = \frac{\left[\sqrt{E_{LL}} - \sqrt{E_{PP}}\right]^2}{\eta \dot{\gamma}}$$

Such a minimum size exists because a minimum flake area is required for enough force to be transferred to result in exfoliation. This means that shear exfoliation (fixed $\dot{\gamma}$) of graphite with a range of lateral crystallite sizes will result of exfoliation of crystallites above this minimum size. This means production of graphene flakes at a range of lateral sizes above $L_{min}$. However, after exfoliation the dispersions are centrifuged to remove any unexfoliated crystallites. It would be expected this to remove both crystallites and exfoliated flakes above some cut-off size, $L_{CF}$. Obviously $L_{CF}$ depends on centrifugation conditions. Thus after centrifugation, the remaining flakes exist in the range of lateral sizes: $L_{min} \leq L \leq L_{CF}$.

The mean flake size can be approximated as $\langle L \rangle \approx (L_{min} + L_{CF})/2$. Changing variable from $\dot{\gamma}$ to N gives $$\langle L \rangle \approx \frac{\Delta R \left[\sqrt{E_{LL}} - \sqrt{E_{PP}}\right]^2}{2\eta \pi ND} + \frac{L_{CF}}{2} \quad (11)$$

Figure 9:
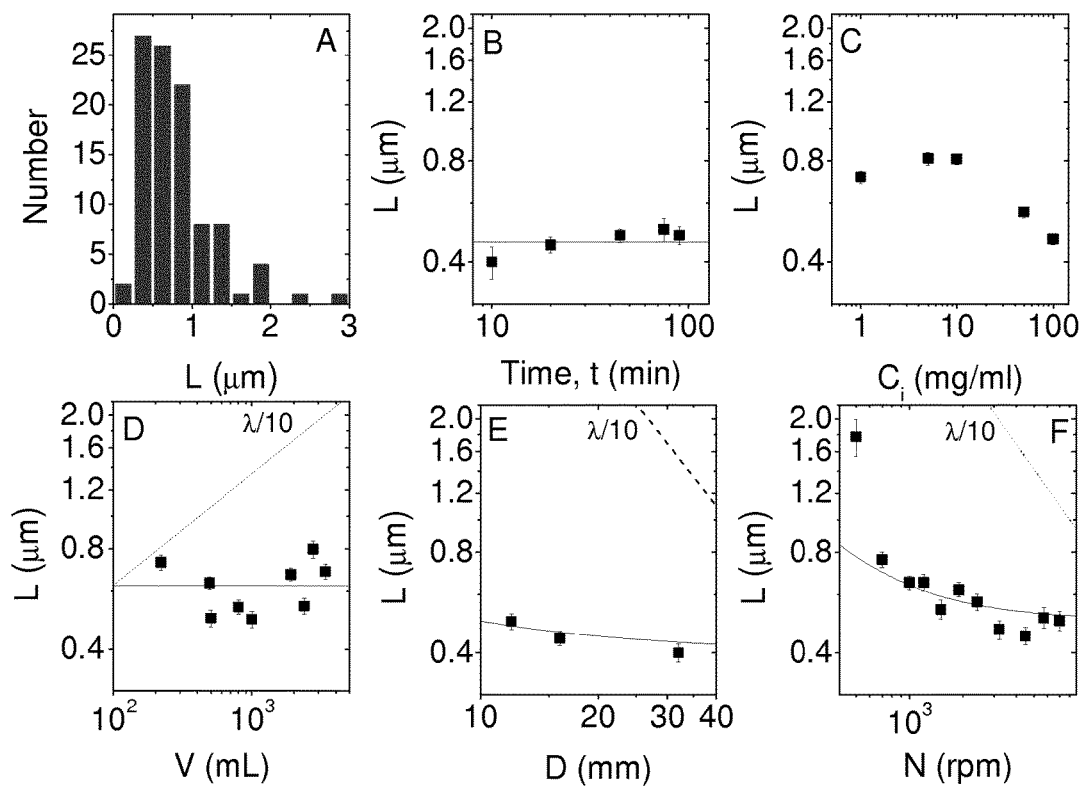
FIG. 9: A) Example of histogram of flake length measured by TEM. B-F) Mean flake length plotted versus B) mixing time, C) initial graphite concentration, D) rotor diameter, E) rotor speed, F) liquid volume. In B and D the solid line represents the mean of the process-independent flake length. In E and F the solid lines are fits to equation 11 with fit parameters: E) $E_{PP}$=70.3 $mJ/m^2$ and $L_{CF}$=800 nm and F) $E_{PP}$=70.3 $mJ/m^2$ and $L_{CF}$=1000 nm.

This is valid when $L_{min} < L_{CF}$. As shown in FIG. 9, this data well describes the data for mean L v both N and D.

This equation can be further simplified by applying the approximation: $(\sqrt{x}-\sqrt{a})^2 \approx (x-a)^2/4a$ to give $$\langle L \rangle \approx \frac{\Delta R [E_{LL} - E_{PP}]^2}{8 E_{PP} \eta \pi ND} + \frac{L_{CF}}{2} = \frac{\Delta R \Delta R_s^2}{8 E_{PP} \eta \pi ND} + \frac{L_{CF}}{2} \quad (11a)$$

where $\Delta E_s$ is difference between solvent and platelet surface energies. This illustrates how the flake length is expected to be sensitive to the difference in surface energies between solvent and platelet.

Solvent Limitations

The mechanism outlined above suggests a natural limit to graphene production in solvents. When $L_{min} \geq L_{CF}$, all graphene flakes produced are big enough to be removed by centrifugation. This occurs when:

$$\frac{|\Delta E_s|}{\sqrt{\eta}} \geq \sqrt{\frac{4\pi L_{CF} E_{PP} ND}{\Delta R}} \quad (12)$$

So, for lab scale exfoliation, assuming $L_{CF}$=1 μm, $E_{PP}$=70 mJ/m$^2$, N=6000 rpm (10 s$^{-1}$) and D=32 mm, the limit of graphene production is at $(|\Delta E_s|/\sqrt{\eta})_{Max}$=0.045. Taking η~0.002, this gives a rough estimate of $|\Delta E_s|_{max}$=2 mJ/m$^2$. This is a relatively narrow range, meaning relatively few solvents are suitable for shear exfoliation. However, on scale-up, the situation is more favourable: assuming $L_{CF}$=1 μm, $E_{PP}$=70 mJ/m$^2$ and ND=5 m/s (i.e. maximised values appropriate for scale-up), the limit of graphene production is at $(|\Delta E_s|/\sqrt{\eta})_{Max}$=0.18. Taking η~0.002, this gives a rough estimate of $|\Delta E_s|_{max}$=8 mJ/m$^2$. This means that on scale-up of shear exfoliation of graphene, solvents in the surface energy range 62-78 mJ/m$^2$ can be used. This is equivalent to the surface tension range of 32-48 mJ/m$^2$. This is a relatively broad range covering many of the solvents which can be used to exfoliate graphene[14, 23] (or other layered compounds[15, 20]).

The Role of the Liquid

Shear mixing in a liquid environment obviously requires the presence of a liquid. However the liquid must have certain properties to get exfoliation of stabilised flakes i.e. those which do not aggregate. The information in the sections above clearly show that if the liquid is a solvent, it must have very specific properties i.e. a combination of surface energy (or surface tension) and viscosity. This combination depends on the scale of the mixing process. Here NMP has been used because it fulfils the criteria set out in Eq (12). However, a small number of other solvents are also possible, for example cyclohexylpyrrolidone. However, there are no circumstances where water can be an effective solvent for shear exfoliation of graphene. The combination of the correct shear parameters i.e. shear rate above a critical value and the correct solvent are critical for successful mixing.

Graphene Production in a Stirred Tank

Tests were also carried out using a tank with an impeller. For simplicity, a Kenwood kitchen blender was used. This consists of a tapered diameter jug, ~100 mm diameter at the base, expanding to ~125 mm at the top. It is fitted with four baffles running the full height of the jug, fixed to the walls projecting 4 mm into the liquid, with a thickness of 1 mm. The impeller consists of 4 blades. Two are angled slightly above horizontal, with a diameter of 53 mm, while two are angled below horizontal with a diameter of 58 mm. The jug capacity is 1.6 L (though working volume is only 1.2 L). It is fitted with a 400 W motor, with a rotational speed of 21000±2000 rpm. With this equipment, because of the plastic body of the blender, experiments have only been performed using water/surfactant mixtures (solvents such as NMP will dissolve the plastic). However, metal stirred tanks are commercially available and could easily be used for solvent mixing. The commonly used and well-known kitchen surfactant, Fairy Liquid®, was used to demonstrate that expensive industrial surfactants are not required.

Figure 5:
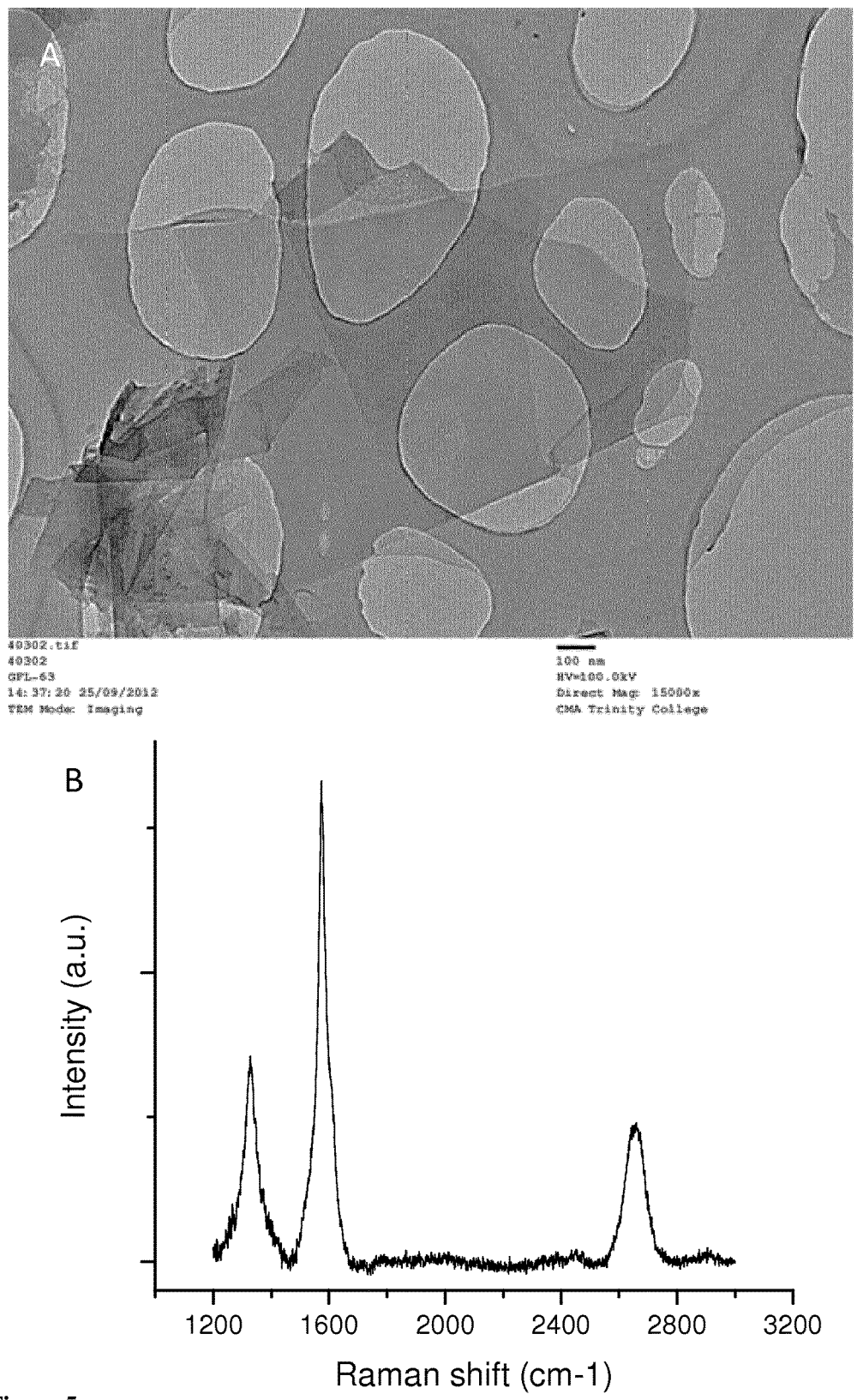
FIG. 5 A) TEM images of graphene flakes produced using the Kenwood blender (water and Fairy Liquid® as solvent). Mixing time=15 min, volume=500 ml, Ci=100 mg/ml. B) Typical Raman spectrum for graphene flakes produced under the same circumstances.

As above, initial tests showed that mixing of graphite in ~1 L of water/surfactant solution using the Kenwood BL 370 gave a black liquid. Subsequent microscopy analysis showed this liquid to contain large quantities of exfoliated graphene nanosheets. TEM showed these to be very thin, with a thickness range of ~1 to ~10 monolayers and lengths of 1200±60 nm (t=30 min, Ci=100 mg/ml, FIG. 5A). Raman spectra are shown in FIG. 5B. As for the Silverson mixer, the ratio of D to G band intensities is consistent with flakes of this size and gives no indication of basal plane defects.

Using the Kenwood mixer, it is only possible to vary t, Ci and V because the blade diameter and speed is fixed. However, the surfactant concentration is another variable. The dispersed graphene concentration as a function of graphene to surfactant ratio (G:FL) was measured for a high (100 mg/ml) and a low (20 mg/ml) initial graphite concentration. This data demonstrates an optimum G:FL ratio of 8:1. This ratio was used for all subsequent experiments. It should be noted that this ratio will depend on the surfactant being used.

Figure 6:
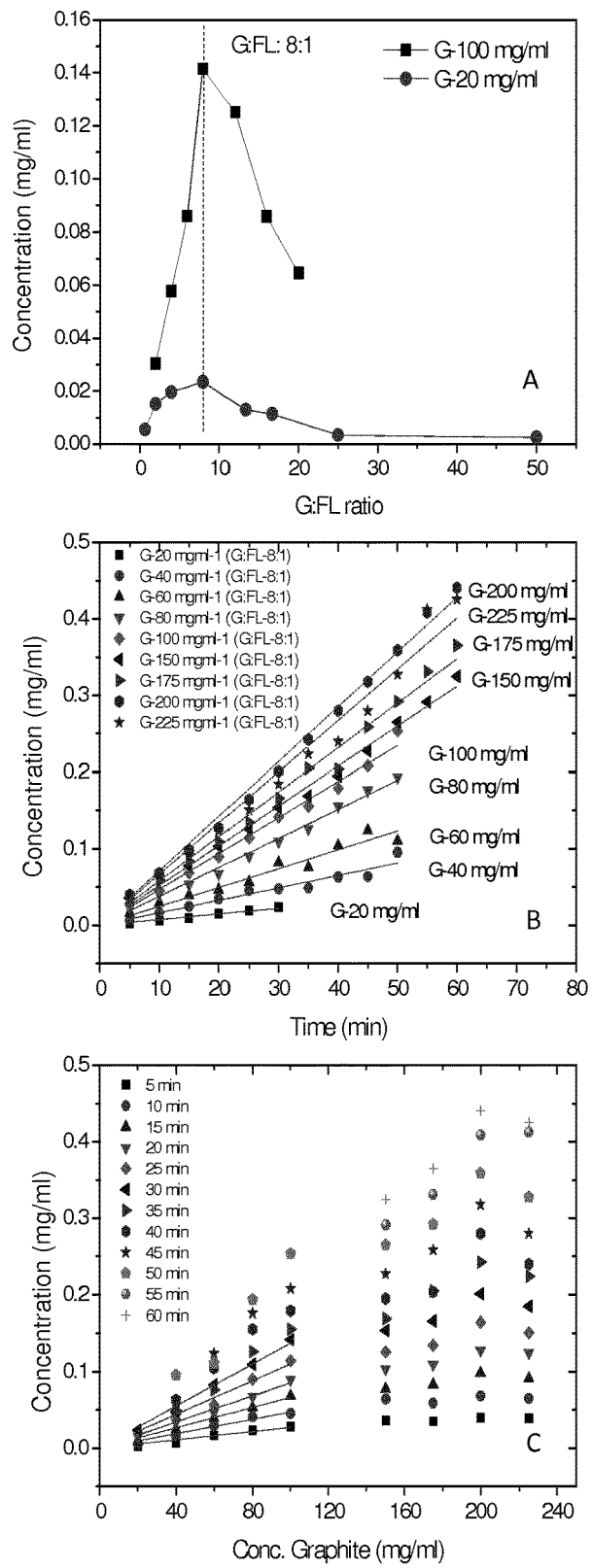
FIG. 6 A) Graphene concentration as a function of graphene to surfactant ratio (G:FL) measured for a high and a low initial graphite concentration. This demonstrates an optimum G:FL ratio of 8:1. B) Graphene concentration as a function of mixing time for a range of different initial graphite concentrations. Linear behaviour is found in all cases. C) Graphene concentration as a function of initial graphite concentration for a range of mixing times. Linear behaviour is found for graphite concentration <100 mg/ml in all cases.

The concentration of dispersed graphene as a function of mixing time for a range of different initial graphene concentrations was then measured. This data is plotted in two ways in FIGS. 6B and 6C, namely as C v t (B) and C v Ci (C). This data shows that the concentration scales linearly with mixing time (in contrast to the rotor/stator high shear mixer). In addition, it was found that the concentration scales linearly with Ci for Ci<100 mg/ml. Above this initial graphite concentration, the dispersed graphene concentration tends to increase more slowly. This behaviour can be summarised as follows:

$$C \propto C_i t$$

This allows the graphene yield to be defined as:

$$Y = dC/dCi$$

and a production rate as:

$$P = dM/dt = VdC/dt$$

Figure 7:
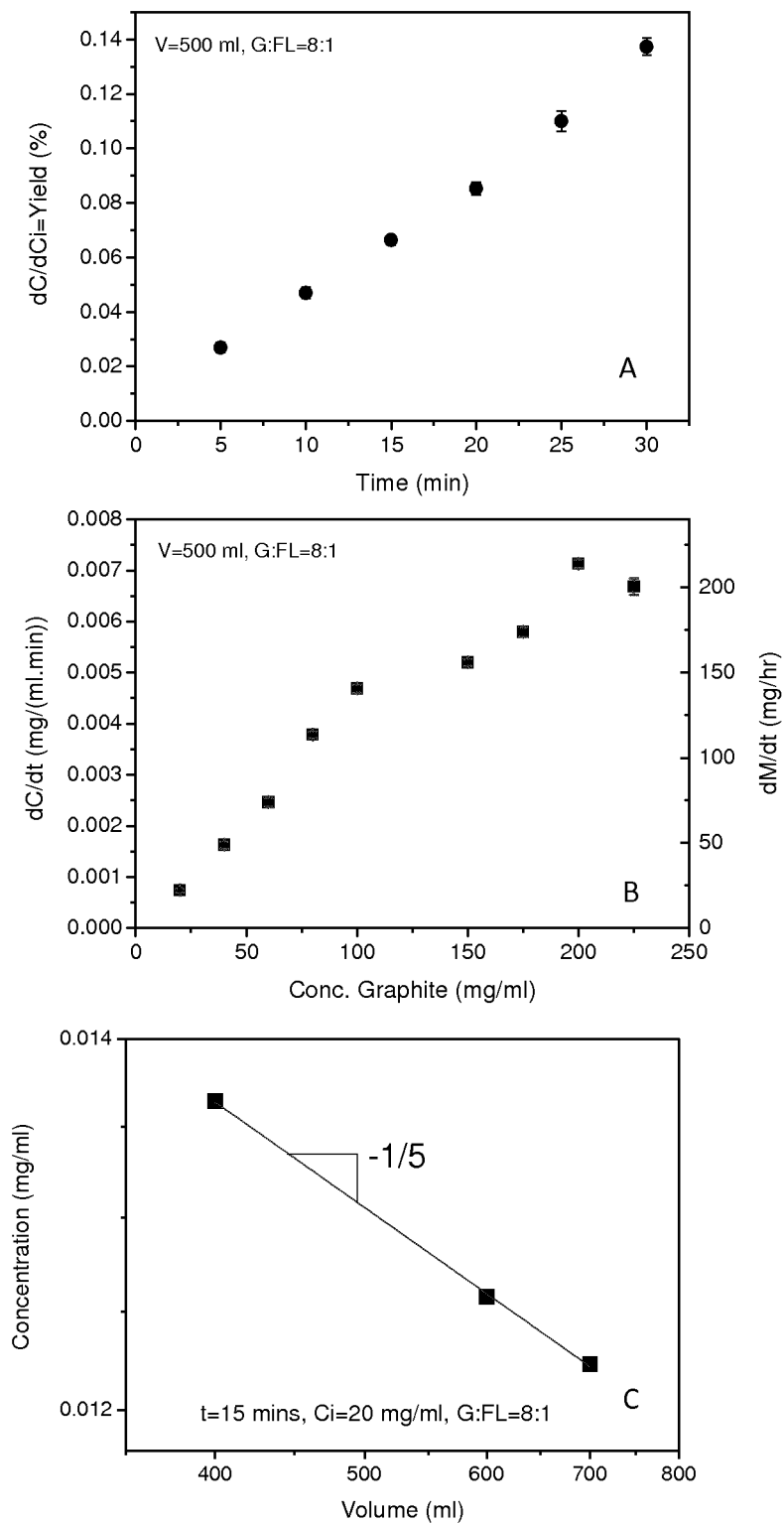
FIG. 7 A) graphene yield plotted as a function of mixing time. B) Graphene production rate (right axis) plotted as a function of initial graphite concentration. C) Graphene concentration plotted against liquid volume, V (log-log).

These parameters are plotted in FIGS. 7A and 7B. The yield increases linearly with mixing time, reaching 0.14% after 30 minutes. Although it appears that these yields are low, in practical terms, this is not a problem as the unexfoliated graphite can be collected after a mixing run and reused as a starting material. In FIG. 7B, the production rate increases linearly with initial graphite concentration up to Ci=100 mg/ml. Above this the production increases slightly more slowly. For an initial graphene concentration of 200 mg/ml, the production rate is ~200 mg/hr (volume V=500 ml).

The effect of liquid volume on concentration was also tested, as illustrated in FIG. 7C. A slow drop in concentration with volume is clearly observed and as described by:

$$C \propto V^{-1/5} \quad (13)$$

This means the scaling law for concentration can be written as $$C \propto C_i t V^{-1/5} \quad (14)$$

And the equivalent scaling law for production rate as $$P \propto C_i V^{4/5} \quad (15)$$

As before, it is possible to estimate what can be achieved by scaling up the volumes. The highest production of 200 mg/hr was achieved for V=500 ml. This means that when mixing at the 1000 L scale, a production rate of ~90 g/hr can be expected, very similar to the high shear mixer.

Quality of the Exfoliated Graphene

Figure 8:
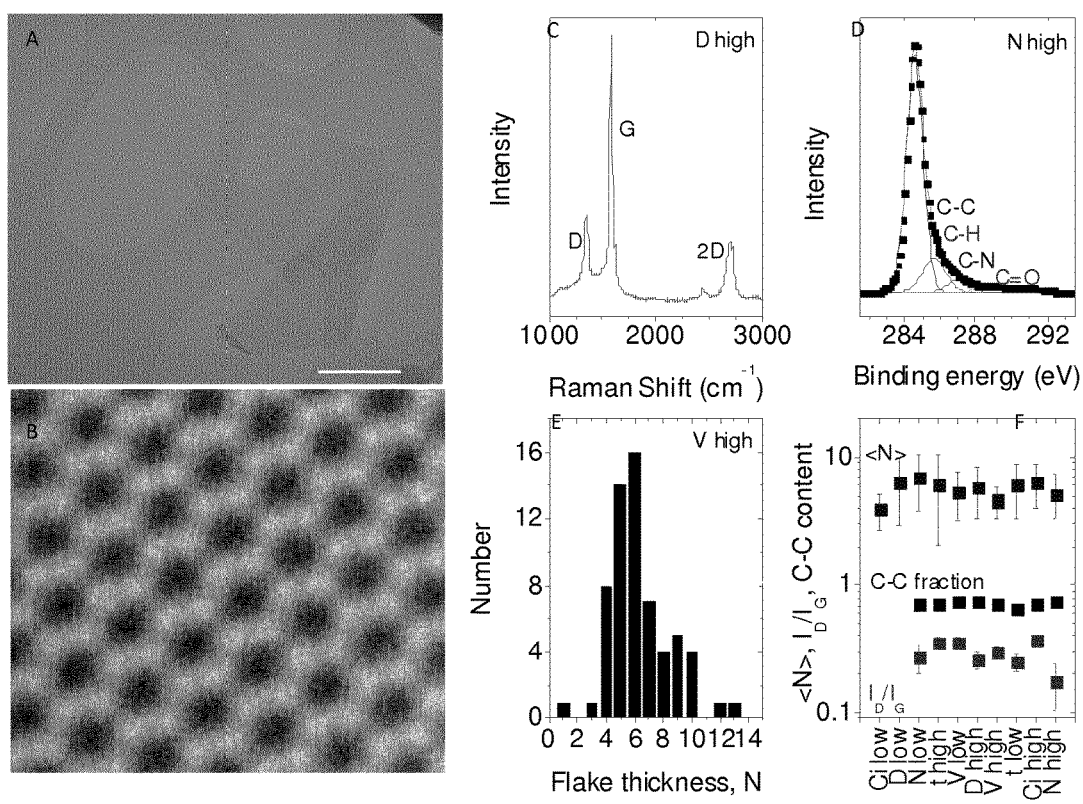
FIG. 8 A) TEM image of a mixer exfoliated graphene flake. B) High resolution scanning TEM image of a mixer exfoliated graphene flake showing atomic structure. C-F) Raman, XPS and nanosheet thickness characterisation was performed for a number of dispersions prepared using both high and low values of each processing parameter (graphite concentration, Ci; mixing time, t; liquid volume, V; rotor speed, N; rotor diameter, D). C-E) Examples of a Raman spectrum, an XPS spectrum and a flake thickness histogram respectively. The dispersion type is indicated in the panel. F) Information extracted from Raman, XPS and flake thickness data plotted versus dispersion type. Blue—mean flake thickness, <N>; black—fraction of XPS spectrum associated with C—C bonds; red—ratio of intensities of Raman D and G bands.

It is important to demonstrate that the high production rate associated with shear mixing is not achieved at the cost of flake quality. Shown in FIG. 8A is a TEM image of a good quality graphene flake. Such images give no information as to whether the flake has been damaged at the atomic scale. Shown in FIG. 8B is a high resolution scanning TEM image of a graphene monolayer produced in the mixer by the process above. It is clear from this image that the atomic structure is perfect with no indication of defects.

To obtain a more quantitative analysis of the flake quality, Raman Spectroscopy, X-Ray Photoelectron Spectroscopy (XPS) and flake thickness measurements were performed on graphene produced at a range of mixer parameters. In general, the parameters used were fixed at constant values (t=20 mins, Ci=50 mg/ml, D=32 mm, V=1500 ml and N=4500 rpm). However, for each sample one parameter was varied such that one sample was prepared at high and low values of each processing parameter. The dispersions were centrifuged and then used to prepare films for Raman and XPS analysis and dropped onto grids for TEM analysis.

As shown in FIG. 8C is a typical Raman spectrum (graphene produced at high D). The D:G band ratio is relatively low, indicating that the defect content of these flakes is low. As described elsewhere in this document, the size of the defect band is entirely consistent with the presence of edge defects and no basal plane defects. Thus, the graphene flakes produced by this method can be said to be defect free.

Shown in FIG. 8D is a typical C1s XPS spectrum (graphene produced at high N). This spectrum is dominated by the C-C peak at ~284 eV, which is associated with graphitic carbon. A number of weaker peaks can be seen at higher binding energy. These are associated with C—H, C—N and C=O suggesting that these are consistent with the presence of residual NMP. They have intensities approximately in the ratio 3:1:0.6, similar to the ratio of 3:1:1 expected for NMP. That these peaks can be explained by NMP suggests that no oxidisation of the graphene has occurred during mixing and so the graphene flakes produced by this method can be said to be non-oxidised. This is critical as oxidisation of graphene results in a considerable change to the physical properties of graphene. Many of the useful properties are lost on oxidisation.

Shown in FIG. 8E is a histogram of flake thickness (measured by intensity of the electron beam lost due to inelastically scattered electrons, sample prepared at high V). The mean flake thickness is ~6 layers. This is reasonably thin and close to that obtained by sonication. This shows that shear mixing gives an excellent degree of exfoliation.

FIG. 8F shows a summary of the Raman, XPS and thickness data over all samples. This data shows the mean flake thickness, the fraction of C1s XPS spectrum due to the C-C peak and the mean D:G ratio for each combination of mixing parameters. It is clearly demonstrated that each parameter hardly varies at all with mixing parameters. This shows clearly that the graphene produced by all studied combinations of mixing parameters is substantially the same. In addition, these flakes are well exfoliated, and free of defects and oxides.

Surfactant Concentrations and 2-Dimensional Material Yield

While the exfoliation of any 2-dimensional material in water/surfactant solutions, for example graphene, has been demonstrated, and has advantages over solvent dispersions in terms of toxicity, the presence of the surfactant residues on the surface of graphene flakes may be detrimental to many subsequent applications. For example, it increases the junction between flakes resulting in lower conductivities of resulting films. It is therefore necessary to use the lowest concentration of surfactant possible without compromising the yield of the process. It is expected that the concentration of exfoliated graphene will be dependent on the concentration of surfactant in solution.

In order to investigate the optimum concentration of surfactant in a water-surfactant solution to optimise yield of an exfoliated 2-dimensional material while minimising the surfactant concentration, a series of experiments were carried out. Graphite was used as the starting 3-dimensional material. It should be understood that the findings of these experiments can be applied to all 3-dimensional starting materials described herein. In all cases the liquid volume, rotor speed, rotor diameter and processing time were kept constant at 600 ml, 4500 rpm, 32 mm and 60 min respectively. The initial graphite concentration ($C_i$) and surfactant concentration ($C_S$) were varied, the latter being set by the desired graphite to surfactant concentration ($C_i/C_S$). Following exfoliation in the high shear mixer, the dispersion was centrifuged at 1500 rpm for 150 min to remove unexfoliated graphite and poorly exfoliated flakes. The supernatant is then analysed by UV-vis spectroscopy to measure the graphene concentration. The supernatant was also filtered through 0.22 μm pore alumina membranes, in order to produce films to record the Raman spectra.

Figure 11:
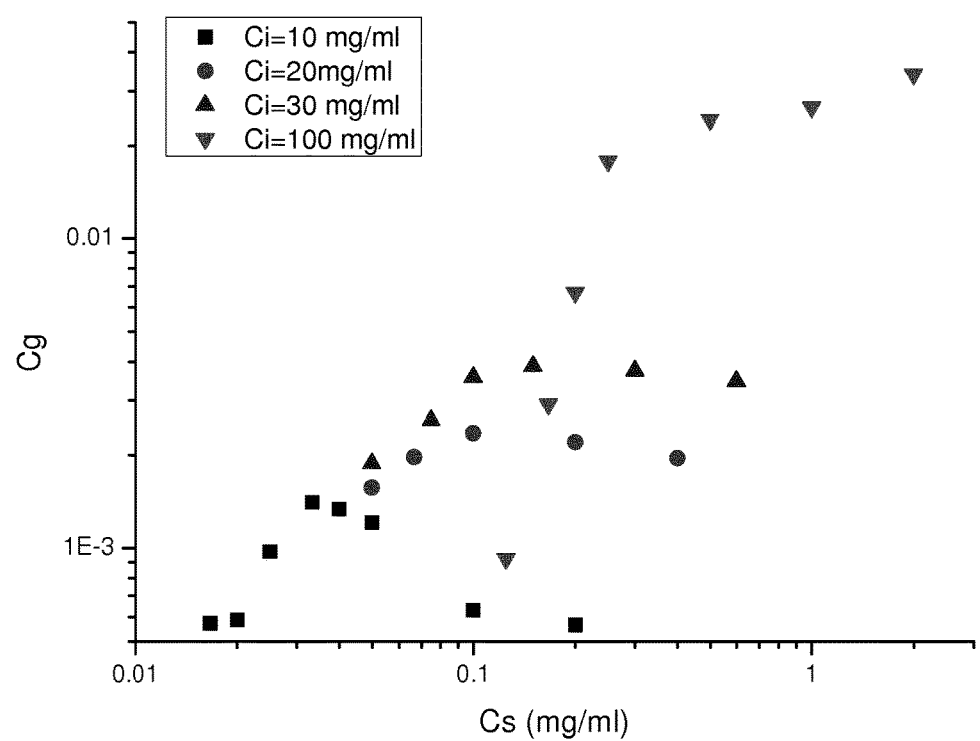
FIG. 11 Dependence of graphene concentration on surfactant concentration, for various initial graphite concentrations. For all graphite concentrations, the exfoliated graphene concentration increases with increasing surfactant concentration. At $c_i/c_s \approx 300\text{-}400$ the behaviour changes however, depending on the initial graphite concentration. At low values of Ci, the graphene concentration starts to fall, whereas at high $C_i$ the graphene concentration continues to increase, albeit at a slower rate.

It has been shown previously that the yield of graphene depends linearly on the initial graphene concentration. It was expected that the same behaviour as that shown above would be seen at all graphite concentrations, when the graphite to surfactant concentration is kept constant. Therefore the graphite concentration was varied between 100 g/L and 10 g/L, varying the surfactant concentration between 0.017 g/L and 2 g/L ($C_i/C_S$=800-50). As shown in FIG. 11, for all graphite concentrations the exfoliated graphene concentration increases with increasing surfactant concentration. At $c_i/c_s \approx$300-400 the behaviour changes however, depending on the initial graphite concentration. At low values of Ci, the graphene concentration starts to fall, whereas at high $C_i$ the graphene concentration continues to increase, albeit at a slower rate.

Figure 12:
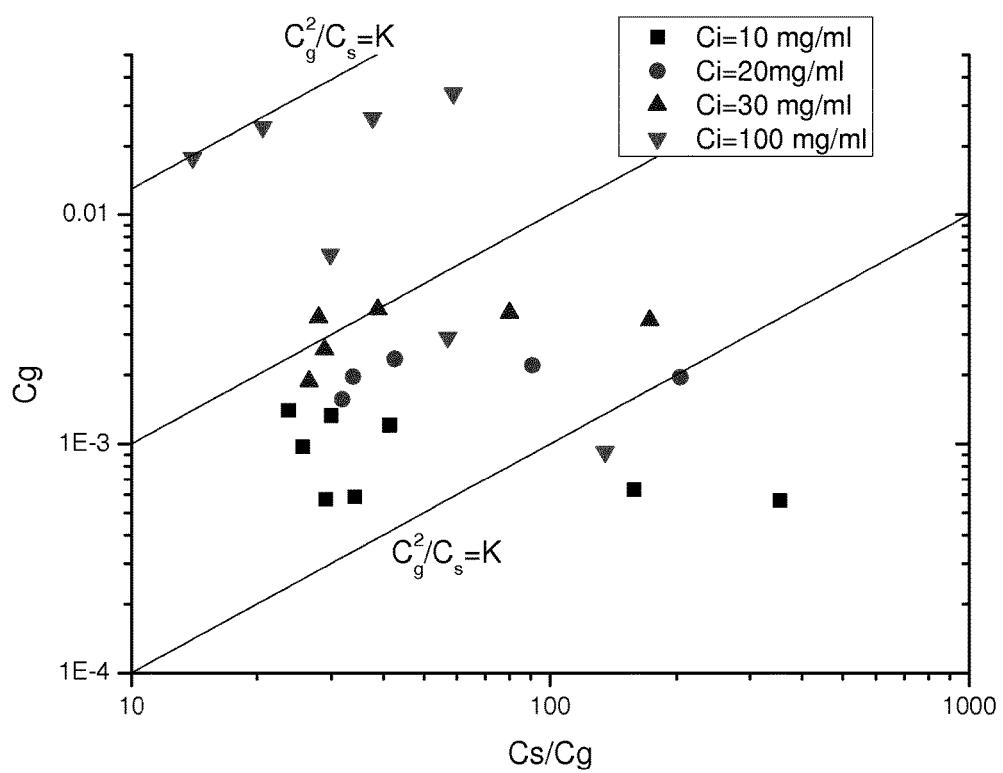
FIG. 12 Figure of merit plot to obtain optimal graphene exfoliation conditions in order to reduce surfactant concentration. In order to obtain the optimum combination of graphite and surfactant concentration, a crude figure of merit has been developed. The aim is to maximise the graphene concentration ($C_G$) while minimising the surfactant to graphene ratio ($C_S/C_G$) and therefore the parameter that needs to be maximised is $c_G^2/c_S$. The data from FIG. 11 has been re-plotted in FIG. 12 as $c_G$ against $c_S/c_G$, with lines of constant $c_G^2/c_S$ also shown. The highest value obtained here is for $C_i$=100 g/L and $C_S$=0.25 g/L.

In order to obtain the optimum combination of graphite and surfactant concentration, a figure of merit has been developed. The aim is to maximise the graphene concentration ($C_G$), while minimising the surfactant to graphene ratio ($C_S/C_G$) and therefore the parameter that needs to be maximised, is $C_G^2/C_S$. The data in FIG. 11 has been re-plotted in FIG. 12 as $C_G$ against $C_S/C_G$, with lines of constant $C_G^2/C_S$ also shown. The highest value obtained here is for $C_i$=100 g/L and $C_S$=0.25 g/L.

Figure 13:
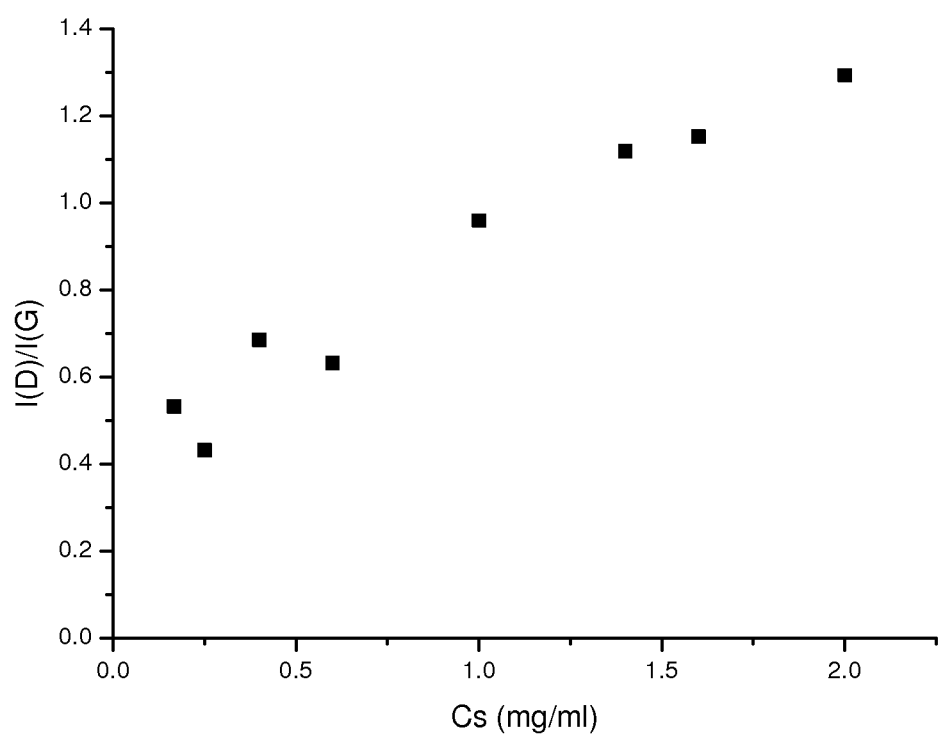
FIG. 13 Variation of D/G intensity ratio from the Raman spectra. Data shown is for variation in both $C_i$ and $C_S$, showing that average flake size falls with increasing surfactant concentration. Measurement of the D/G intensity ratio from the Raman spectrum also suggests that as the surfactant concentration is increased, the average flake size is decreasing. This is found regardless of the initial graphite concentration where both $C_i$ and $C_i/C_S$ has been varied.

Measurement of the D/G intensity ratio from the Raman spectrum also suggests that as the surfactant concentration is increased, the average flake size is decreasing. This is found regardless of the initial graphite concentration, as shown in FIG. 13, where both $C_i$ and $C_i/C_S$ has been varied.

Concentrating and Washing Exfoliated 2-Dimensional Materials

While shear exfoliation is capable of large production rates of, for example, defect-free graphene, many applications require graphene dispersions at concentrations above 1 g/L. It may also be necessary to remove surfactants from the dispersion, where exfoliation has been carried out in water/surfactant solutions, as described above. Dead-end vacuum filtration has been used previously to obtain free-standing films of graphene from dispersions, and this method also allows surfactant residues to be washed from the graphene during film formation. However at large scales necessary for industrial production, this approach becomes prohibitively slow due to pore-blocking.

Figure 14:
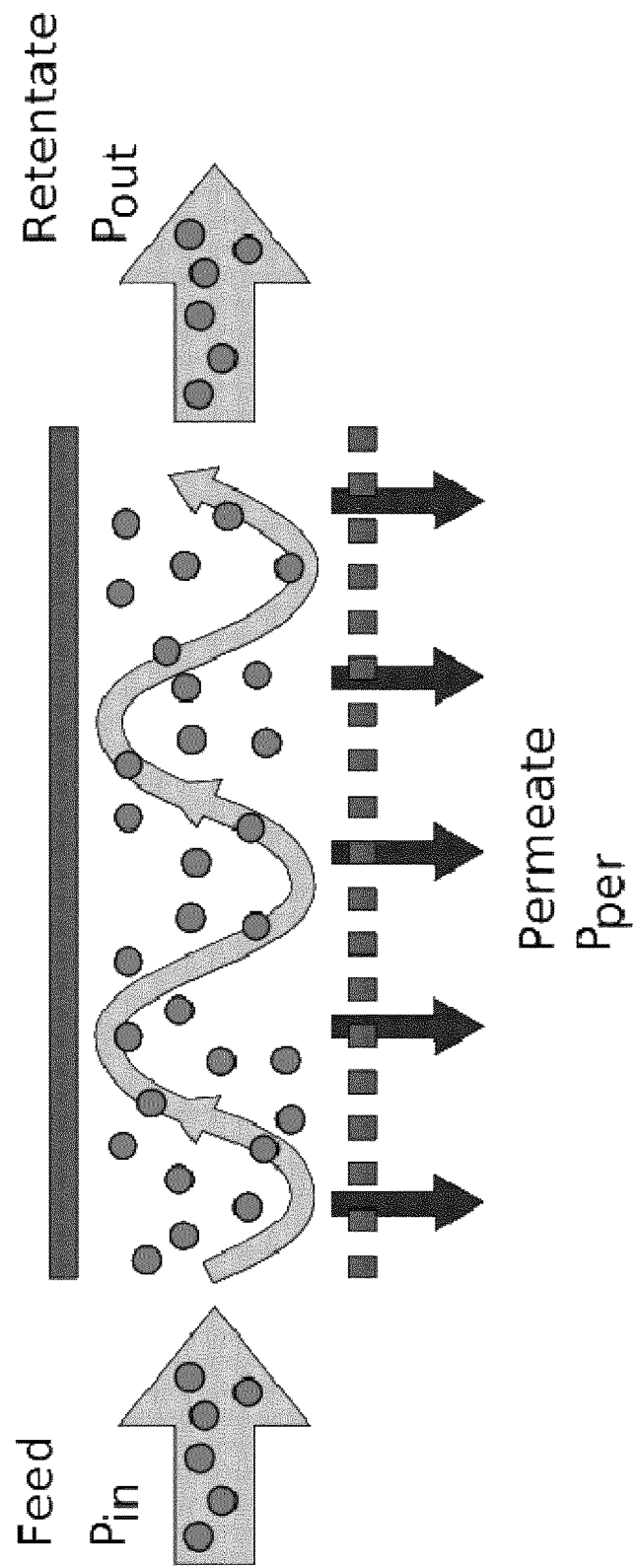
FIG. 14 Schematic of cross-flow, or tangential flow filtration. The feed solution is continually flowing across the membrane preventing the particles from blocking the pores, allowing permeate flux to be maintained.

An alternative method for concentrating and washing the graphene dispersions is to use a cross-flow, or tangential-flow filtration equipment. In this filtration design, the feed-material is passed tangentially across a filter membrane, which has a pressure-drop applied across it. This pressure-drop supplies the driving force for the liquid to pass through, while the fluid flow prevents the particles from blocking the pores of the membrane. This is shown schematically in FIG. 14. Typically multiple passes across the membrane are required to obtain the required concentration factor, with a recirculating loop being utilised to achieve this. Using such a system, a dispersion of initial concentration of ~0.5 g/L has been successfully concentrated to 28 g/L, and then washed to remove surfactant molecules from the solution. Both hollow-fibre and cassette geometries have been successfully used for this concentration and washing procedure. This allows for preparation of high concentration graphene dispersions (or high concentrations of any exfoliated 2-dimensional material), such as pastes and inks, for easier processing in applications.

Applications of Mixer Exfoliated Graphene

Figure 10:
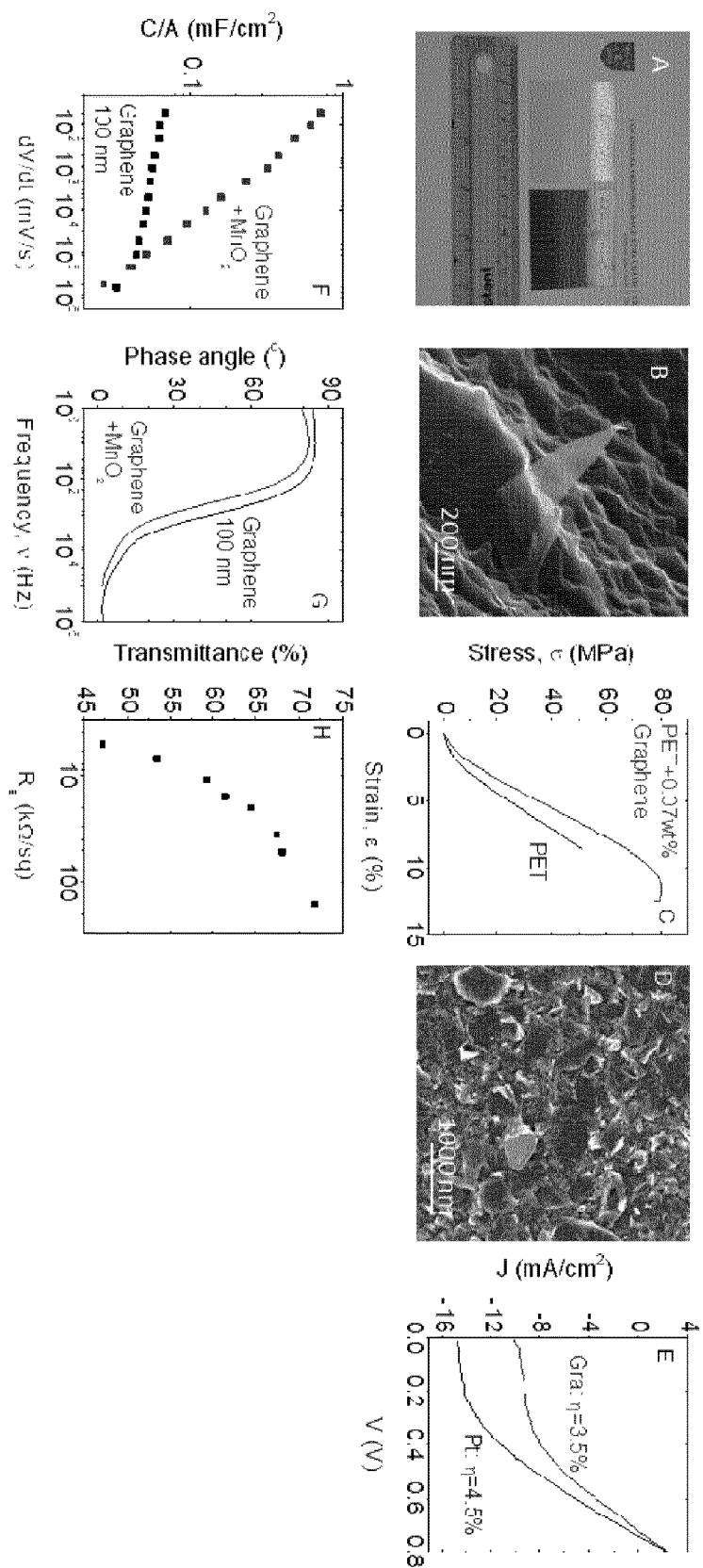
FIG. 10 Applications of mixer exfoliated graphene. A) Melt processed pieces of (left) PET and (right) PET:Graphene-0.07%. B) Helium ion micrograph of graphene sheet protruding from a composite fracture surface. C) Representative stress strain curves of PET and PET:Graphene-0.07%. D) SEM image of the surface of a vacuum filtered graphene film. E) I-V curves for dye sensitised solar cells with an ITO/Pt counter electrode and where the ITO/Pt has been replaced by mixer exfoliated graphene. F) Capacitance (from cyclievoltametry) as a function of scan rate for supercapacitor electrodes consisting of (black) a 100 nm thick graphene film and a (red) a 100 nm graphene film coated with MnO2. G) Impedance phase angle versus frequency for the films described in F. H) Transmittance as a function of sheet resistance for spray-deposited thin graphene films.

Because the graphene produced by shear mixing is of high quality, it is likely to be of use in a range of applications. This is illustrated herein by demonstrating examples of the use of mixer-exfoliated graphene in five different applications. Probably the most important application of mass produced graphene flakes will be as a filler in composites. To be compatible with the plastics industry, such composites must be produced by melt processing. For these experiments, a Brabender melt mixer has been used to mix exfoliated graphene into the plastic polyethylene terephthalate (PET). Shown in FIG. 10A is a photograph of a PET sheet and a graphene/PET sheet (0.07% graphene), both of which produced by melt mixing. The Helium ion micrograph in FIG. 10B shows that the graphene flakes are well-exfoliated within the composite. Mechanical testing (see FIG. 10C) demonstrates the strength of the composite to be approximately twice that of the PET. This is consistent with the best reports of reinforcement using graphene as a filler.

A number of possible applications will require thin films of graphene flakes. An SEM image of a vacuum filtered thin graphene film is shown in FIG. 10D. Such films can be used to replace both the Platinum/Iridium Tin Oxide (Pt/ITO) counter electrode in dye sensitised solar cells resulting in only a small drop in efficiency (see FIG. 10E). As the Pt/ITO counter electrode is relatively expensive, replacement with cheap graphene could result in significant cost savings.

Similar films can be used to make supercapacitor electrodes with reasonable capacitance (see FIG. 10F). The capacitance can be further increased by coating the graphene with $MnO_2$. Such supercapacitors have relatively high capacitance coupled with low time constant and are ideal for microsupercapacitor applications for 120 Hz ac line filtering applications. The phase angle at 120 Hz can be used as a "factor of merit"; the graphene electrode displays $\phi_{120}=79°$ ($MnO_2$ coated electrode gives $\phi_{120}=70°$), values which are comparable with commercial aluminium electrolytic capacitors (83°) (see FIG. 10G). Alternatively, graphene films can be spray-deposited so as to be thin enough to be semi-transparent. Transmittances of 55-70% can be achieved for sheet resistances of 10-100 kOhm/sq (see FIG. 10H). These films can be used in applications where cost, not performance, is key e.g. static dissipaters or heat shields for oven windows, and are likely to be competitive with oxide based transparent conductors.

The current invention addresses the problem of providing a simple, scalable process for the production of exfoliated 2-dimensional material, for example, graphene production. The process takes pure graphite, and uses it to produce graphene in a usable form with no pre-treatments of the graphite, removing the need for complex and/or hazardous chemistry steps. The technique is known to be highly scalable, allowing large volumes to be processed. Critically the production rate increases as the liquid volume increases. This will allow economies of scale to be achieved. Very high production rates of g/hr have been demonstrated herein and with the application of the newly elucidated scaling laws for graphene (and other 2-dimensional material as described above), production of kg/day should be attainable on scale-up to the $m^3$ level.

In the specification the terms "comprise, comprises, comprised and comprising" or any variation thereof and the terms "include, includes, included and including" or any variation thereof are considered to be totally interchangeable and they should all be afforded the widest possible interpretation and vice versa.

The invention is not limited to the embodiments hereinbefore described but may be varied in both construction and detail.

REFERENCES

1. Geim, A. K.; Novoselov, K. S., The rise of graphene. Nature Materials 2007, 6 (3), 183-191.
2. Novoselov, K. S.; Geim, A. K.; Morozov, S. V.; Jiang, D.; Zhang, Y.; Dubonos, S. V.; Grigorieva, I. V.; Firsov, A. A., Electric field effect in atomically thin carbon films. Science 2004, 306 (5696), 666-669.
3. Lee, C.; Wei, X. D.; Kysar, J. W.; Hone, J., Measurement of the elastic properties and intrinsic strength of monolayer graphene. Science 2008, 321 (5887), 385-388.
4. Bae, S.; Kim, H.; Lee, Y.; Xu, X. F.; Park, J. S.; Zheng, Y.; Balakrishnan, J.; Lei, T.; Kim, H. R.; Song, Y. I.; Kim, Y. J.; Kim, K. S.; Ozyilmaz, B.; Ahn, J. H.; Hong, B. H.; Iijima, S., Roll-to-roll production of 30-inch graphene films for transparent electrodes. Nature Nanotechnology 2010, 5 (8), 574-578.
5. Berger, C.; Song, Z. M.; Li, X. B.; Wu, X. S.; Brown, N.; Naud, C.; Mayo, D.; Li, T. B.; Hass, J.; Marchenkov, A. N.; Conrad, E. H.; First, P. N.; de Heer, W. A., Electronic confinement and coherence in patterned epitaxial graphene. Science 2006, 312 (5777), 1191-1196.
6. (a) Kim, K. S.; Zhao, Y.; Jang, H.; Lee, S. Y.; Kim, J. M.; Kim, K. S.; Ahn, J.-H.; Kim, P.; Choi, J.-Y.; Hong, B. H., Large-scale pattern growth of graphene films for stretchable transparent electrodes. Nature 2009; (b) Li, X. S.; Cai, W. W.; An, J. H.; Kim, S.; Nah, J.; Yang, D. X.; Piner, R.; Velamakanni, A.; Jung, I.; Tutuc, E.; Banerjee, S. K.; Colombo, L.; Ruoff, R. S., Large-Area Synthesis of High-Quality and Uniform Graphene Films on Copper Foils. Science 2009, 324 (5932), 1312-1314.
7. Kuilla, T.; Bhadra, S.; Yao, D. H.; Kim, N. H.; Bose, S.; Lee, J. H., Recent advances in graphene based polymer composites. Progress in Polymer Science 2010, 35 (11), 1350-1375.
8. Ruoff, R., Calling all chemists. Nature Nanotechnology 2008, 3 (1), 10-11.
9. Zhan, Y. J.; Liu, Z.; Najmaei, S.; Ajayan, P. M.; Lou, J., Large-Area Vapor-Phase Growth and Characterization of MoS2 Atomic Layers on a SiO2 Substrate. Small 2012, 8 (7), 966-971.
10. Stankovich, S.; Dikin, D. A.; Piner, R. D.; Kohlhaas, K. A.; Kleinhammes, A.; Jia, Y.; Wu, Y.; Nguyen, S. T.; Ruoff, R. S., Synthesis of graphene-based nanosheets via chemical reduction of exfoliated graphite oxide. Carbon 2007, 45 (7), 1558-1565.
11. Dreyer, D. R.; Park, S.; Bielawski, C. W.; Ruoff, R. S., The chemistry of graphene oxide. Chemical Society Reviews 2010, 39 (1), 228-240.
12. Shih, C. J.; Vijayaraghavan, A.; Krishnan, R.; Sharma, R.; Han, J. H.; Ham, M. H.; Jin, Z.; Lin, S. C.; Paulus, G. L. C.; Reuel, N. F.; Wang, Q. H.; Blankschtein, D.; Strano, M. S., Bi- and trilayer graphene solutions. Nature Nanotechnology 2011, 6 (7), 439-445.
13. (a) Eda, G.; Yamaguchi, H.; Voiry, D.; Fujita, T.; Chen, M. W.; Chhowalla, M., Photoluminescence from Chemically Exfoliated MoS2. Nano Letters 2011, 11 (12), 5111-5116; (b) Joensen, P.; Frindt, R. F.; Morrison, S. R., Single-Layer MoS2. Materials Research Bulletin 1986, 21 (4), 457-461.
14. Hernandez, Y.; Nicolosi, V.; Lotya, M.; Blighe, F. M.; Sun, Z. Y.; De, S.; McGovern, I. T.; Holland, B.; Byrne, M.; Gun'ko, Y. K.; Boland, J. J.; Niraj, P.; Duesberg, G.; Krishnamurthy, S.; Goodhue, R.; Hutchison, J.; Scardaci, V.; Ferrari, A. C.; Coleman, J. N., High-yield production of graphene by liquid-phase exfoliation of graphite. Nature Nanotechnology 2008, 3 (9), 563-568.
15. Coleman, J. N.; Lotya, M.; O'Neill, A.; Bergin, S. D.; King, P. J.; Khan, U.; Young, K.; Gaucher, A.; De, S.; Smith, R. J.; Shvets, I. V.; Arora, S. K.; Stanton, G.; Kim, H. Y.; Lee, K.; Kim, G. T.; Duesberg, G. S.; Hallam, T; Boland, J. J.; Wang, J. J.; Donegan, J. F.; Grunlan, J. C.; Moriarty, G.; Shmeliov, A.; Nicholls, R. J.; Perkins, J. M.; Grieveson, E. M.; Theuwissen, K.; McComb, D. W.; Nellist, P. D.; Nicolosi, V., Two-Dimensional Nanosheets Produced by Liquid Exfoliation of Layered Materials. Science 2011, 331 (6017), 568-571.
16. Smith, R. J.; King, P. J.; Lotya, M.; Wirtz, C.; Khan, U.; De, S.; O'Neill, A.; Duesberg, G. S.; Grunlan, J. C.; Moriarty, G.; Chen, J.; Wang, J. Z.; Minett, A. I.; Nicolosi, V.; Coleman, J. N., Large-Scale Exfoliation of Inorganic Layered Compounds in Aqueous Surfactant Solutions. Advanced Materials 2011, 23 (34), 3944-+.
17. Alhassan, S. M.; Qutubuddin, S.; Schiraldi, D. A., Graphene Arrested in Laponite-Water Colloidal Glass. Langmuir 2012, 28 (8), 4009-4015.

18. Hall, S.; Cooke, M.; Pacek, A. W.; Kowalski, A. J.; Rothman, D., Scaling up of silverson rotor-stator mixers. *Canadian Journal of Chemical Engineering* 2011, 89 (5), 1040-1050.

19. Doran, P. M., *Bioprocess Engineering Principles*. Academic Press: London, 1995.

20. Cunningham, G.; Lotya, M.; Cucinotta, C. S.; Sanvito, S.; Bergin, S. D.; Menzel, R.; Shaffer, M. S. P.; Coleman, J. N., Solvent Exfoliation of Transition Metal Dichalcogenides: Dispersability of Exfoliated Nanosheets Varies only Weakly Between Compounds. *Acs Nano* 2012, 6 (4), 3468-3480.

21. Lyklema, J., The surface tension of pure liquids—Thermodynamic components and corresponding states. *Colloids and Surfaces a-Physicochemical and Engineering Aspects* 1999, 156 (1-3), 413-421.

22. Tsierkezos, N. G.; Filippou, A. C., Thermodynamic investigation of N,N-dimethylformamide/toluene binary mixtures in the temperature range from 278.15 to 293.15 K. *Journal of Chemical Thermodynamics* 2006, 38 (8), 952-961.

23. Hernandez, Y.; Lotya, M.; Rickard, D.; Bergin, S. D.; Coleman, J. N., Measurement of Multicomponent Solubility Parameters for Graphene Facilitates Solvent Discovery. *Langmuir* 2010, 26 (5), 3208-3213.

The invention claimed is:

1. A process for exfoliating an untreated 3-dimensional layered material to produce a 2-dimensional material, said process comprising the steps of:
   mixing the untreated 3-dimensional layered material in a liquid to provide a mixture;
   applying a shear force to said mixture to exfoliate the 3-dimensional layered material and produce a dispersed and exfoliated 2-dimensional material in solution; and
   removing the shear force applied to said mixture, such that the dispersed exfoliated 2-dimensional material remains free and unaggregated in solution,
   wherein the shear force generates a shear rate greater than 1000 s$^{-1}$, and
   wherein the liquid does not contain a thickening or gelating agent.

2. The process according to claim 1, wherein flakes of 2-dimensional material and unexfoliated 3-dimensional layered material are removed from the solution by low-speed centrifugation, gravity settling, filtration or flow separation.

3. The process according to claim 1, wherein the 2-dimensional material is substantially non-oxidised.

4. The process according to claim 1, further comprising the step of allowing the formation of a thin film layer from said mixture.

5. The process according to claim 1, further comprising the step of allowing the formation of a thin film layer from said mixture and wherein the step of forming the thin film layer is formed by vacuum filtration or accelerated evaporation.

6. The process according to claim 1, wherein the 3-dimensional layered material is selected from the group consisting of a 3-dimensional layered compound, a 3-dimensional layered element, a transition metal dichalcogenide having the formula MX$_n$, wherein 1≤n≤3, a transition metal oxide, boron nitride (BN), Bi$_2$Te$_3$, Sb$_2$Te$_3$, TiNCl, and an inorganic layered compound.

7. The process according to claim 1, wherein the 3-dimensional layered material is graphite.

8. The process according to claim 1, wherein the liquid may be a solvent, a water-surfactant solution or a solution of a polymer in a solvent wherein the solvent has a surface tension range of between 32-48 mJ/m$^2$.

9. The process according to claim 1, wherein the exfoliated 2-dimensional material is concentrated and washed using cross-flow or tangential filtration.

10. The process according claim 1, further comprising the step of inserting the exfoliated 2-dimensional material into a matrix to form a composite.

11. The process according to claim 1, further comprising the step of inserting the exfoliated 2-dimensional material into a matrix to form a composite and wherein the matrix is a polymer or copolymer selected from the group consisting of a thermoplastic, a thermoset, an elastomer and a biopolymer.

12. A device comprising a mixture of exfoliated 2-dimensional material produced according to the process comprising the steps of mixing an untreated 3-dimensional layered material in a liquid to provide a mixture; applying shear force to said mixture to exfoliate the 3-dimensional layered material and produce a dispersed and exfoliated 2-dimensional material in solution; and removing the shear force applied to said mixture, such that the dispersed exfoliated 2-dimensional material remains free and unaggregated in solution and any other nano-material, wherein the shear force generates a shear rate greater than 1000 s$^{-1}$, and wherein the liquid does not contain a thickening or gelating agent.

13. The device according to claim 12, wherein the exfoliated material is graphene.

14. The device according to claim 12, wherein the nano-material is selected from the group comprising graphene, inorganic layered compounds, a one-dimensional nano-material or nanoparticles.

15. The device according to claim 12, wherein the device is selected from the group comprising electrodes, transparent electrodes, capacitors, transistors, solar cells, light emitting diodes, batteries, battery electrodes, capacitors, supercapacitors, sensors, nano-transistors, nano-capacitors, nano-light emitting diodes, and nano-solar cells.

16. A dye-sensitised solar cell electrode comprising exfoliated graphene produced by the process comprising the steps of mixing an untreated 3-dimensional layered material in a liquid to provide a mixture; applying shear force to said mixture to exfoliate the 3-dimensional layered material and produce a dispersed and exfoliated 2-dimensional material in solution; and removing the shear force applied to said mixture, such that the dispersed exfoliated 2-dimensional material remains free and unaggregated in solution, wherein the shear force generates a shear rate greater than 1000 s$^{-1}$, and wherein the liquid does not contain a thickening or gelating agent.

* * * * *